US010215351B2

(12) United States Patent
Spiro

(10) Patent No.: US 10,215,351 B2
(45) Date of Patent: Feb. 26, 2019

(54) SYSTEMS AND METHODS FOR AN INTERMEDIATE DEVICE STRUCTURE

(71) Applicant: Daniel S. Spiro, Scottsdale, AZ (US)

(72) Inventor: Daniel S. Spiro, Scottsdale, AZ (US)

( * ) Notice: Subject to any disclaimer, the term of this patent is extended or adjusted under 35 U.S.C. 154(b) by 0 days.

(21) Appl. No.: 15/884,107

(22) Filed: Jan. 30, 2018

(65) Prior Publication Data

US 2018/0180234 A1 Jun. 28, 2018

Related U.S. Application Data

(63) Continuation of application No. 14/757,923, filed on Dec. 28, 2015, now Pat. No. 9,885,451, which is a
(Continued)

(51) Int. Cl.
*F21S 8/08* (2006.01)
*H04W 88/08* (2009.01)
(Continued)

(52) U.S. Cl.
CPC .......... *F21S 8/086* (2013.01); *F21V 23/0442* (2013.01); *F21V 23/06* (2013.01); *F21V 29/74* (2015.01);
(Continued)

(58) Field of Classification Search
CPC .. F21S 8/085; F21S 8/088; F21S 9/035; F21S 9/043; F21W 2131/103; H04W 84/18;
(Continued)

(56) References Cited

U.S. PATENT DOCUMENTS 6,307,330 B1 10/2001 So
RE38,767 E 8/2005 Wedell et al.
(Continued)

FOREIGN PATENT DOCUMENTS

CN 202617435 12/2012
CN 203352881 12/2013
(Continued)

*Primary Examiner* — William J Carter
(74) *Attorney, Agent, or Firm* — Schmeiser, Olsen & Watts, LLP

(57) ABSTRACT

A network of intermediate device systems may be detachably coupled to an illumination pole electrically connected to a power source. The intermediate device system may comprise a housing with an exterior surface and an interior cavity configured to receive at least one electrical device. The intermediate device system may comprise a control unit communicatively coupled to a processor and configured to receive and process substantially real-time information from at least one of the electronic devices and create a data set based on the received real-time information. The data set may comprise a parameter of the surrounding environment and/or an instruction set configured to operate the at least one electrical devices within the intermediate device system and/or a second intermediate device system within the network. The intermediate device system may also comprise a communication module communicatively coupled to the control unit that forms a bidirectional communication channel to facilitate transfer of the data set between the intermediate device system and a second communication module of the second intermediate device system and receive an incoming data set from the second communication module.

12 Claims, 27 Drawing Sheets

Related U.S. Application Data continuation-in-part of application No. 14/166,056, filed on Jan. 28, 2014, now Pat. No. 9,829,185.

(60) Provisional application No. 61/757,340, filed on Jan. 28, 2013.

(51) Int. Cl.

| | | |
|---|---|---|
| *F21V 23/04* | (2006.01) | |
| *F21V 23/06* | (2006.01) | |
| *F21V 29/74* | (2015.01) | |
| *H05B 33/08* | (2006.01) | |
| *H05B 37/02* | (2006.01) | |
| *F21W 131/103* | (2006.01) | |

(52) U.S. Cl.
CPC ........ *H04W 88/08* (2013.01); *H05B 33/0803* (2013.01); *H05B 37/0272* (2013.01); *F21W 2131/103* (2013.01); *Y10T 29/49117* (2015.01)

(58) Field of Classification Search
CPC .. H05B 37/0272; H05B 37/034; Y02B 20/40; Y02B 20/72
USPC ............................ 362/431; 455/507; 340/635
See application file for complete search history.

(56) References Cited

U.S. PATENT DOCUMENTS

| | | | |
|---|---|---|---|
| 8,475,002 | B2 | 7/2013 | Maxik et al. |
| 9,363,861 | B2 | 7/2016 | Chalmers et al. |
| 2007/0109142 | A1 | 5/2007 | McCollough |
| 2008/0310850 | A1 | 12/2008 | Pederson et al. |
| 2010/0029268 | A1 | 2/2010 | Myer et al. |
| 2011/0187559 | A1* | 8/2011 | Applebaum ............. B60Q 1/00 340/907 |
| 2012/0038281 | A1* | 2/2012 | Verfuerth ........... H05B 37/0272 315/152 |
| 2012/0044350 | A1 | 2/2012 | Verfuerth |
| 2012/0250302 | A1 | 10/2012 | Edwards et al. |
| 2013/0088864 | A1 | 4/2013 | Verdes et al. |
| 2014/0036521 | A1 | 2/2014 | Elliott |
| 2014/0084795 | A1 | 3/2014 | Cumpston et al. |

FOREIGN PATENT DOCUMENTS

| | | |
|---|---|---|
| KR | 101294684 | 8/2013 |
| KR | 20130120326 | 11/2013 |
| WO | 2007033053 | 3/2007 |
| WO | 20130011485 | 1/2013 |

\* cited by examiner

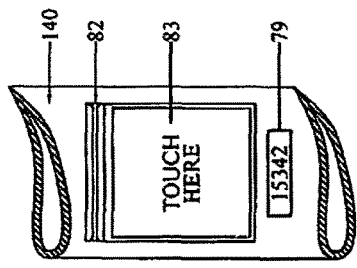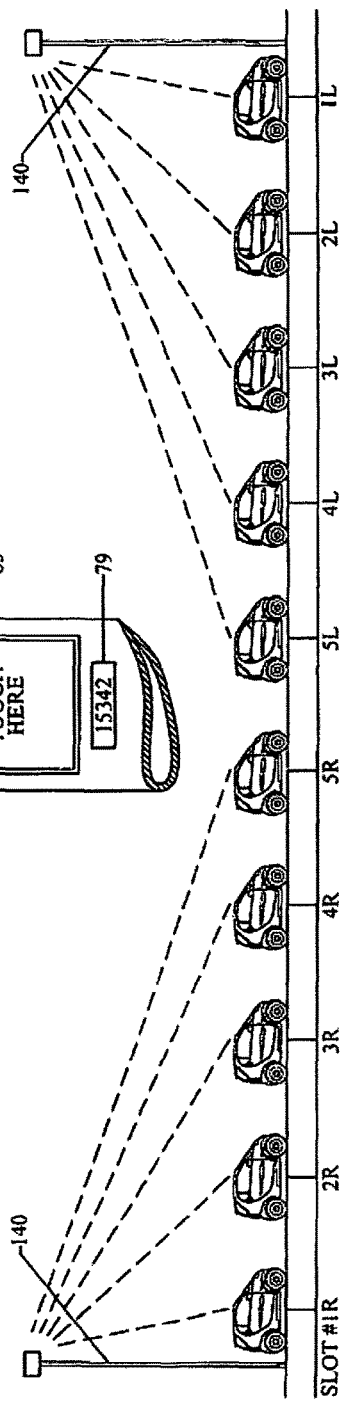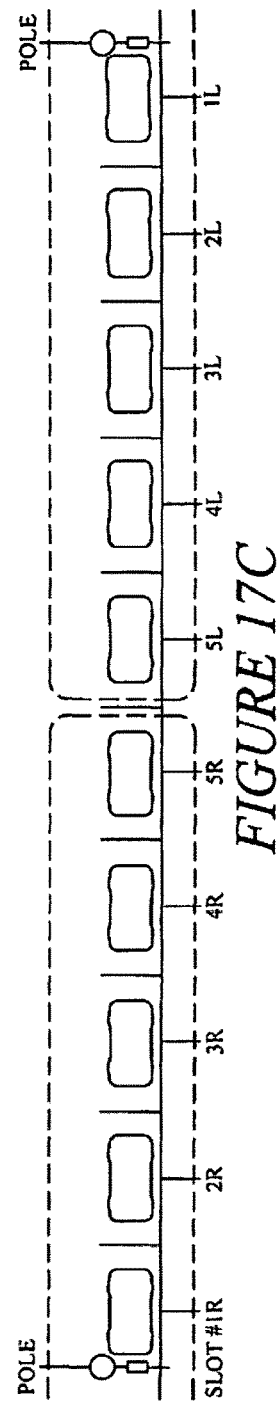

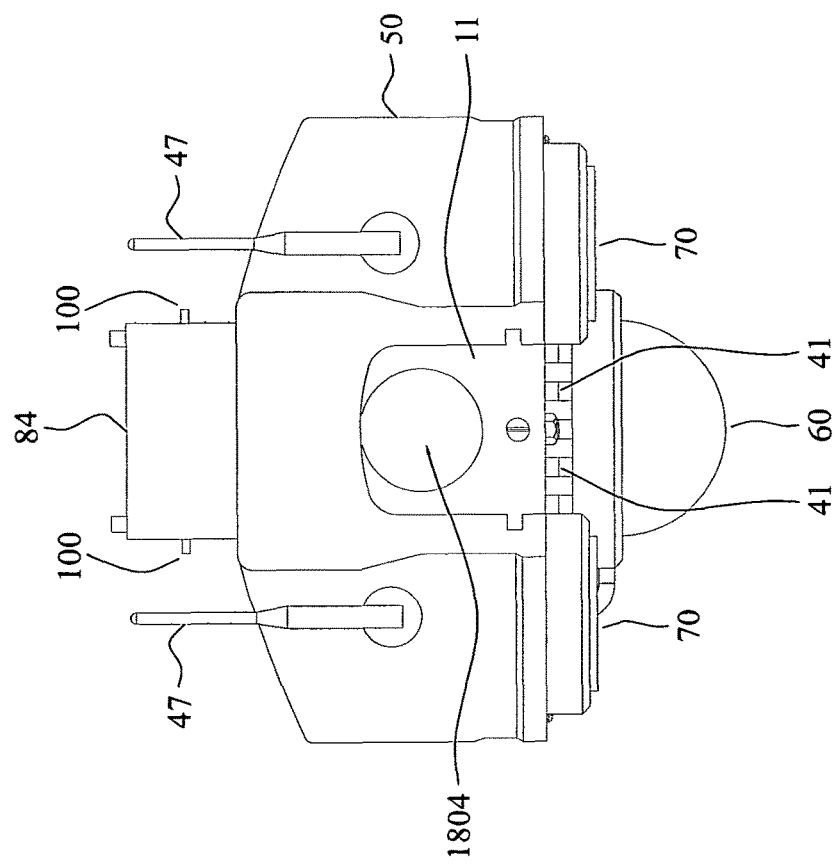

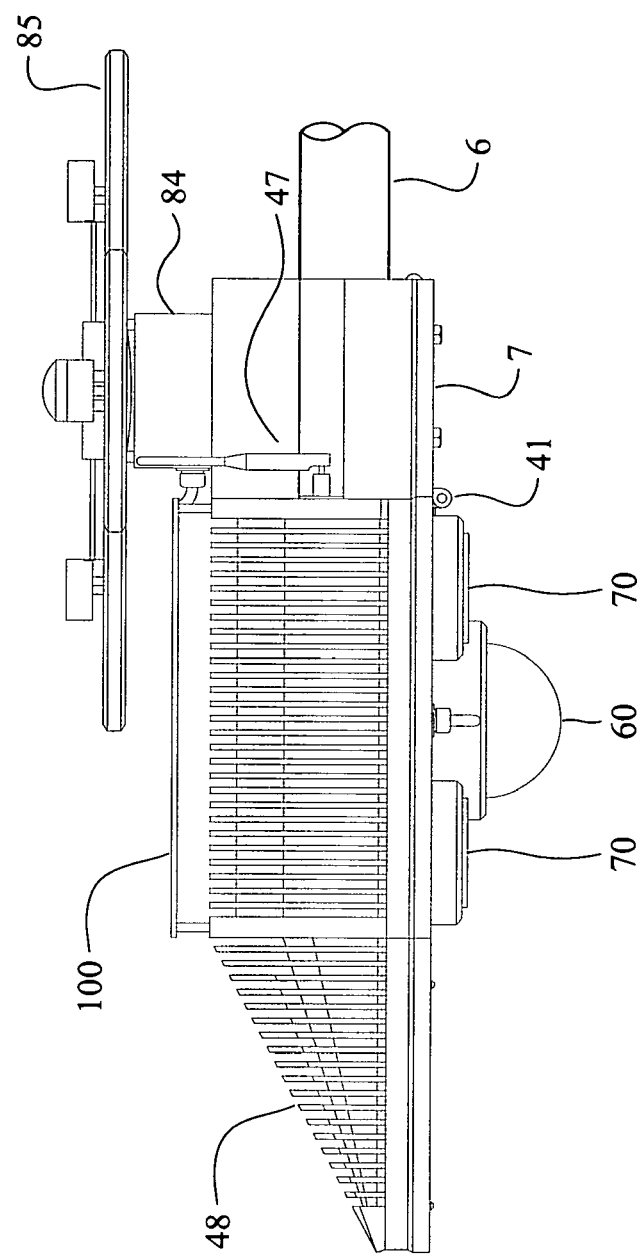

SYSTEMS AND METHODS FOR AN INTERMEDIATE DEVICE STRUCTURE

CROSS-REFERENCES TO RELATED APPLICATIONS

This application is a continuation and claims the benefit of U.S. patent application Ser. No. 14/757,923 filed Dec. 28, 2015; which is a continuation-in-part and claims the benefit of U.S. patent application Ser. No. 14/166,056 filed Jan. 28, 2014, entitled INTERMEDIATE DEVICE STRUCTURE FOR ILLUMINATION POLES AND A METHOD OF USE THEREOF; which claims the benefit of U.S. Provisional Application No. 61/757,340 filed Jan. 28, 2013 and U.S. Provisional Application No. 611757,035 filed Feb. 20, 2013; this application also claims the benefit of U.S. Provisional Application No. 62/096,394 filed Dec. 23, 2014, and incorporates the disclosure of each application by reference. To the extent that the present disclosure conflicts with any referenced application, however, the present disclosure is to be given priority.

BACKGROUND OF INVENTION

Current system and methods for a networked system of smart light pole devices are limited in both their ability to gather data relating to its local environment as well as their ability to communicate data relating to its local environment to additional smart light pole devices in the network. For example, current smart light pole devices do not have the capability of transmitting and/or receiving information and/or instructions from a first smart light pole device directly to a plurality of additional smart light pole devices. In these cases, a centralized server/node must be implemented to relay information and/or instructions from a first smart light pole device to a plurality of additional smart light pole devices. This method of information and/or instruction transmission is slowed and can be prone to outside security risks. Furthermore, using a relay system may negatively affect the real-time transmission of information and/or data, reducing the effectiveness of the overall system.

Street poles dot our modern landscape, from city parks to parking lots and from pedestrian walkways to commuter roadways, just to name a few. Some of these street poles are also illumination poles. Illumination poles serve to illuminate their respective surroundings to provide visibility in darkly lit environments and/or during the night hours when there is a natural absence of light. By supplying visibility in environments otherwise low on light, these illumination poles provide value to a community through an added measure of safety, security, and convenience.

With particular reference to roadways, illumination poles can be set up at intersections to assist both vehicle and pedestrian traffic in safely navigating the intersection in low-light settings. In addition thereto, illumination poles can be set up along roadways at predetermined intervals, depending on the illumination capabilities of the luminaire attached to the pole and the light intensity desired by the municipality, to assist both vehicle and pedestrian traffic along the roadway. City parks, parking lots, garages, walking paths, and other common areas also utilize illumination poles in a similar fashion.

But with the advent of the technological revolution, including advances in power generation, power distribution, and power and data connectivity as well as a variety of electronic devices having increasingly better processing capabilities and connectivity, municipalities are beginning to use these advances to transform their respective landscapes into "smarter" landscapes. For example, conventional traffic lights and conventional illumination poles, and their accompanying structure, are becoming increasingly populated with additional lighting and non-lighting related devices that improve the lights' and poles' collective utility to the community. Cameras are sometimes mounted on traffic lights to monitor traffic flow. Photocells are sometimes mounted on illumination poles to automate the activation of light from the luminaire in low-light conditions.

However, this transformation of the traffic light or the illumination pole to include additional lighting and/or non-lighting related devices is not without problems. Consider, for example, that adding, removing, or somehow altering components of the illumination pole may compromise the structural integrity of the pole itself. Changes to the illumination pole may create structural weaknesses or introduce susceptibility to corrosion. Also, changes to the illumination pole may not only diminish the aesthetic architectural appeal originally intended by the designer but also degrade the uniformity and beauty of the illumination poles chosen by the municipality. Mounting after-market cameras and/or additional products to an illumination pole may diminish the original aesthetic appeal by creating unsightly structural configurations and wiring and by introducing unpleasant disparity between poles.

In addition, changes to the illumination pole may prevent the proliferation of additional improvements and/or components due to inadequate space allocation on the pole. For example, a device manufacturer's interest in the illumination pole is limited to its respective discipline. If, therefore, one device is added to the pole that monopolizes space allocation, then it could be possible that other device manufacturers may be dissuaded from pursuing future improvements to the pole due to the lack of space. In other words, the first discipline to occupy the pole could do so at the expense of other disciplines to follow. Such inefficiency is not beneficial to the municipality or the citizens thereof.

The lighting industry is transforming from electromagnetic to electronic technology. Similarly, electronic technology is developing electronic devices with increasingly better processing capabilities and connectivity. Yet, despite the lighting industry becoming more and more interested on incorporating intelligent systems or "smart" systems to provide a variety of lighting system functions, few advances have been made in developing efficient, economical, and aesthetically pleasing smart illumination poles, due at least in part to historical legacy, complexity, and cost. Each individual developer of design improvements carries with it costs associated with research and development, upfront equipment purchase, installation, operation, and maintenance.

In view of the foregoing, there is thus a need in the lighting industry for an apparatus that can establish standards and methods for device cohabitation on illumination poles, as these poles are increasingly included in the smart grid revolution, The present disclosure addresses these concerns.

SUMMARY OF THE INVENTION

Various embodiments of the present technology may comprise a network of intermediate device systems configured to be detachably coupled to an illumination pole electrically connected to a power source. The intermediate device system may comprise a housing with an exterior surface and an interior cavity configured to receive at least one electrical component. The intermediate device system may comprise a control unit disposed within the interior cavity of the housing and communicatively coupled to a processor. The control unit may be configured to receive and process substantially real-time information from at least one of the electronic devices and create a data set based on the received real-time information. In some embodiments, the data set may comprise at least one of: a parameter of the surrounding environment and an instruction set configured to operate the at least one of the electrical devices within the intermediate device system and/or a second intermediate device system within the network of intermediate device systems. The intermediate device system may also comprise a communication module disposed within the interior cavity of the housing and communicatively coupled to the control unit. The communication module may form a bidirectional communication channel to facilitate transfer of the data set between the control unit of the intermediate device system and a second communication module of the second intermediate device system and receive an incoming data set from the second communication module.

BRIEF DESCRIPTION OF THE DRAWINGS

A more complete understanding of the present invention may be derived by referring to the detailed description when considered in connection with the following illustrative figures. In the following figures, like reference numbers refer to similar elements and steps throughout the figures.

FIG. 17A is a cut away view of components of an embodiment of an intermediate device structure/system in accordance with the present disclosure;

FIG. 17B is a side view of components of an embodiment of an intermediate device structure/system in accordance with the present disclosure;

FIG. 17C is a top view of components of an embodiment of an intermediate device structure/system shown in FIG. 17B, in accordance with the present disclosure;

FIG. 18G is a rear view of the different embodiment of the intermediate device structure/system in accordance with the present disclosure;

FIG. 18I is a side view of the different embodiment of the intermediate device structure/system in accordance with the present disclosure.

DETAILED DESCRIPTION OF EXEMPLARY EMBODIMENTS

A detailed description of the hereinafter described embodiments of the disclosed apparatus and method are presented herein by way of exemplification and not limitation with reference to the FIGS. listed above. Although certain embodiments are shown and described in detail, it should be understood that various changes and modifications may be made without departing from the scope of the appended claims. The scope of the present disclosure will in no way be limited to the number of constituting components, the materials thereof, the shapes thereofe, the relative arrangement thereof, etc., and are disclosed simply as an example of embodiments of the present disclosure.

As a preface to the detailed description, it should be noted that, as used in this specification and the appended claims, the singular forms "a", "an" and "the" include plural referents, unless the context clearly dictates otherwise.

The conventional street pole or public utility pole is a largely untapped vertical real estate asset that communities, municipalities, and device manufacturers alike can begin to develop to increase economic value to both the government and private sector as well as improve quality of life for ordinary citizens, and particularly those in urban settings.

Figure 1A:
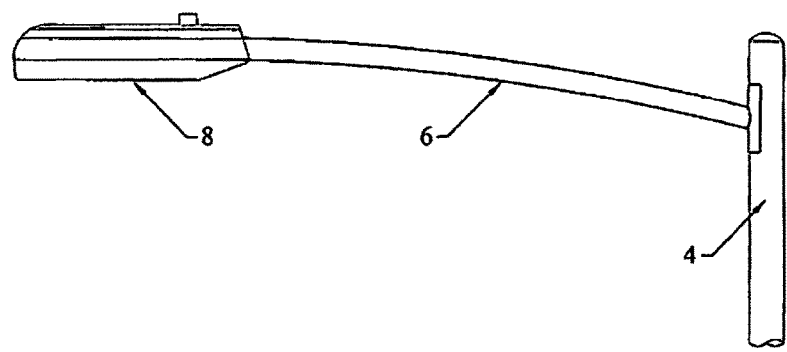
FIG. 1A is a side view of components of a conventional illumination pole in accordance with the present disclosure.
Figure 1B:
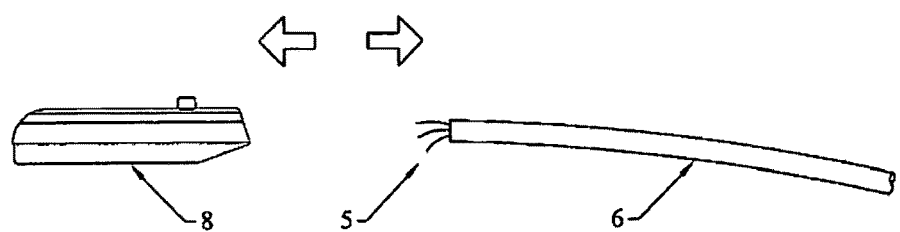
FIG. 1B is an exploded side view of components of the conventional illumination pole shown in FIG. 1, in accordance with the present disclosure.

As shown in FIGS. 1A and 1B, a conventional pole 2 (herein depicted and described as an illumination pole) may comprise pole 4, mast arm 6 that connects to pole 4, and luminaire 8 that physically couples to mast arm 6 at another end of mast arm 6 not connected to pole 4. One end of pole 4 may be imbedded in a ground or grade surface 3 or coupled to surface 3 by an additional support structure, such as a cement slab, to ensure that pole 4 may rise vertically from surface 3 into the air. Mast arm 6 can typically be coupled to pole 4 near the top of pole 4 or at least at a height thereof that is sufficient to permit luminaire 8 to provide the desired amount of light to the surrounding area near illumination pole 2. Conventional illumination pole 2 may further comprise electrical wiring 5 running from the municipality's electric grid through pole 4 and mast arm 6 to luminaire 8 to electrically connect and power luminaire 8.

As a result of the preconfigured electric grid and each conventional illumination pole's established electric connectivity thereto, each conventional illumination pole 2 is currently underutilized as an electrified vertical real estate asset of the community. In other words, the full value of illumination pole 2 as housing for smart devices and as an integral component of an overall smart grid of any particular community is not yet realized. However, the intermediate device structure (IDS) of the present disclosure for use with illumination poles 2 can standardize the means and methods of maximizing this largely-dormant electrified vertical resource.

Figure 2D:
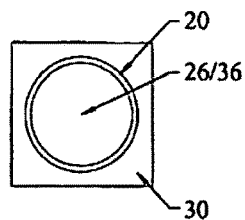
FIG. 2D is a front view of the components of an embodiment of an intermediate device structure/system shown in FIG. 2A, in accordance with the present disclosure.
Figure 2A:
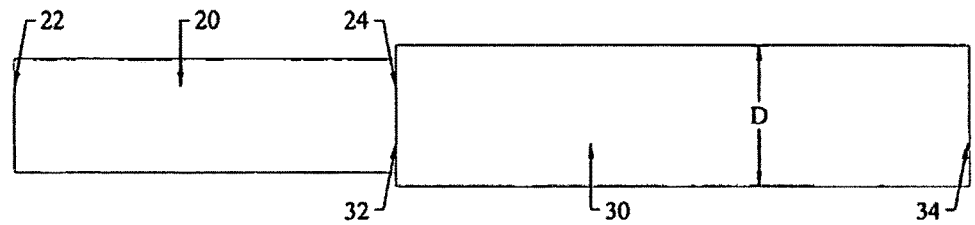
FIG. 2A is a side view of components of an embodiment of an intermediate device structure/system in accordance with the present disclosure.
Figure 2B:
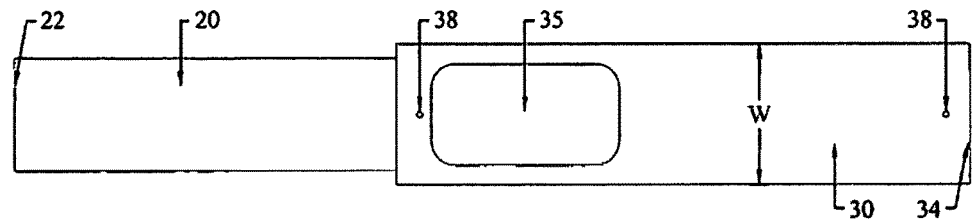
FIG. 2B is a top view of the components of an embodiment of an intermediate device structure/system shown in FIG. 2A, in accordance with the present disclosure.
Figure 2C:
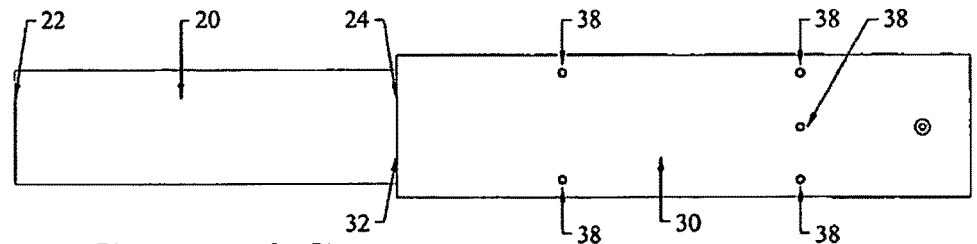
FIG. 2C is a bottom view of the components of an embodiment of an intermediate device structure/system shown in FIG. 2A, in accordance with the present disclosure.
Figure 3:
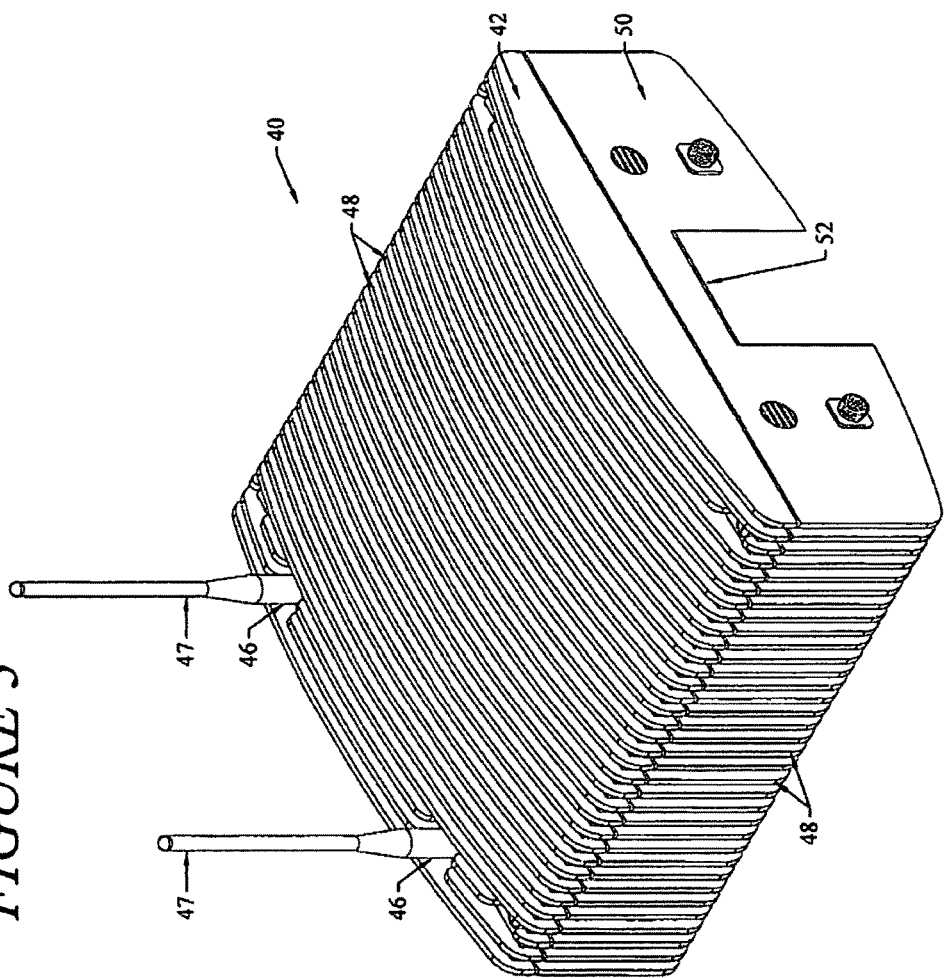
FIG. 3 is a top perspective view of components of an embodiment of an intermediate device structure/system in accordance with the present disclosure.

Referring to the drawings, FIGS. 2A-3 depict various components of an embodiment of an intermediate device system (IDS) 10 that may be utilized in conjunction with an illumination pole 2. Coupling IDS 10 to conventional illumination pole 2 converts pole 2 into smart pole 140. Embodiments of IDS 10 may comprise various structural and functional components that complement one another to provide the unique functionality and performance of IDS 10, the structure and function of which will be described in greater detail herein. Components of IDS 10 may comprise, among others, coupling arm 20, base member 30 and housing 40, each of which is to be discussed in greater detail herein.

With reference to FIGS. 2A-2D, embodiments of IDS 10 may comprise coupling arm 20. Coupling arm 20 may comprise a generally cylindrical shape having an axial length defined between a first end 22 and a second end 24. Coupling arm 20 may have a through bore 26 running from first end 22 to second end 24. Coupling arm 20 may define an outer diameter 28. Coupling arm 20 may have a size and shape that approximates the shape and size of roast arm 6 of conventional illumination pole 2. Outer diameter 28 of coupling arm 20 may taper from either first end 22 to second end 24 or from second end 24 to first end 22, such that outer diameter 28 is not constant along an axial length of coupling arm 20. In alternative embodiments, coupling arm 20 may have a constant cylindrical outer diameter 28. In yet further alternative architectural configurations, coupling arm 20 need not be cylindrical in shape, but may instead be any other suitable three-dimensional shape. Additionally, coupling arm 20 may be expanded both axially and radially to accommodate device scalability.

Embodiments of IDS 10 may comprise base member 30. Base member 30 may comprise a generally rectangular shape having a length defined between a first end 32 and a second end 34. Base member 30 may have a through bore 36 running from first end 32 to second end 34. Base member 30 may define an outer width W, as depicted in FIG. 2B. Base member 30 may also define an outer depth D, as depicted in FIG. 2A. In yet further alternative architectural configurations, base member 30 need not be rectangular in shape, but may instead be any other suitable three-dimensional shape. Additionally, base member 30 may be expanded both vertically and horizontally to accommodate device scalability. Base member 30 may further define an access opening 35 in a top surface, as depicted in FIG. 2B. Access opening 35 may be a substantially large opening that provides easy access from the exterior of base member 30 to the interior of through bore 36. Base member 30 may further define one or more bores 38 therein in one or more sides thereof, as depicted in FIGS. 2B and 2C. Bores 38 may be a hole, passageway, or other opening which can serve as an attachment point for additional components of IDS 10. Embodiments of the IDS 10 may further comprise through bore 26 and through bore 36 being axially aligned, as depicted in FIG. 2D.

Embodiments of IDS 10 may further comprise base member 30 being configured to be functionally and/or structurally coupled to coupling arm 20, and in particular second end 24 of coupling arm 20 may be coupled to first end 32 of base member 30 such that coupling arm 20 and base member 30 are structurally and functionally secured to one another thereby. Embodiments of IDS 10 may further comprise coupling arm 20 and base member 30 being assembled by joining casted and non-casted elements together. Alternatively, coupling arm 20 and base member 30 may be monolithically casted or printed in a unitary or single piece. Coupling arm 20 and base member 30 may be manufactured from a heat dissipating, non-corrosive material and may be painted or otherwise treated to suit architectural needs. The configuration of IDS 10 provides a rigid design suitable in adverse environments.

Embodiments of IDS 10 may comprise coupling arm 20 being configured to receive and retain thereon luminaire 8 and base member 30 being configured to receive and retain therein mast arm 6. In other words, embodiments of IDS 10 may comprise coupling arm 20 and base member 30 being configured to be inserted between and oriented in line with mast arm 6 and luminaire 8 of illumination pole 2. Conventional illumination poles 2 used on roadways are typically configured to have mast arm 6 extend over the street and sidewalk such that luminaire 8 is deployed over vehicle and pedestrian traffic. Industry standards have harmonized the arm tip dimensions of mast arm 6 so manufacturers of luminaires 8 may build luminaires 8 to fit the standard mast arm 6. The tip of mast arm 6 is therefore dimensionally common to most roadway luminaires 8. As a result, first end 22 of coupling arm 20 may be physically and functionally shaped and sized to functionally engage luminaire 8. Once assembled in this way, coupling arm 20 and luminaire 8 may thereafter be retained on one another by fastening means, such as screws, bolts, mechanical clasps, friction fit, and the like. In like manner, through bore 36 of base member 30 may be physically and functionally shaped and sized to functionally engage the tip end of mast arm 6 of conventional illumination pole 2. Base member 30 may therefore be configured to receive mast arm 6 within through bore 36. In particular, second end 34 of base member 30 may be inserted onto mast arm 6 and base member 30 and mast arm 6 may thereby be coupled to one another by fastening means, such as screws, bolts, mechanical clasps, friction fit, and the like. Any of the fastening means described herein may further comprise sealing members, such as neoprene-like washers, that may function together with the fastener and/or the bores 36 to seal the junction between component parts against moisture ingress.

With reference to FIGS. 3-6, embodiments of IDS 10 may comprise housing 40, which may further comprise, among additional components, a housing cover 42 and a housing body 50. Housing cover 42 and housing body 50 may each be manufactured from a heat dissipating, non-corrosive material and may be painted or otherwise treated to suit architectural needs and/or to withstand outdoor environments. Embodiments of IDS 10 may further comprise housing body 50 being integrally formed with coupling arm 20 and base member 30, such that housing body 50, coupling arm 20 and base member 30 are a single unitary piece of material, such materials perhaps being a heat dissipating, non-corrosive material that may be painted or otherwise treated to suit architectural needs and to withstand outdoor environments.

With reference to FIG. 3, embodiments of IDS 10 may further comprise housing cover 42 and housing body 50 being configured to functionally engage and couple to one another. For example, housing cover 42 may include an underside surface 44 and an internal step 45 on the perimeter of underside surface 44. Internal step 45 may be configured to compliment and cooperate with a raised lip 55 on the exterior perimeter of housing body 50. A sealing member, such as an 0-ring gasket, may be configured between housing cover 42 and housing body 50. The sealing member may take the shape of internal step 45 or raised lip 55. Therefore, under the condition that housing cover 42 is placed over housing body 50, with the sealing member positioned there between, internal step 45 may functionally engage raised lip 55, or vice versa, to create a weather-proof or moisture-resistant seal between housing body 50 and housing cover 42 to establish a moisture-resistant housing 40. Housing cover 42 and housing body 50 may further comprise corresponding bores 38 that are configured to permit housing cover 42 and housing body 50 to be coupled to one another by fastening members, such as screws, bolts, mechanical clasps, friction fit, and/or the like.

Figure 4:
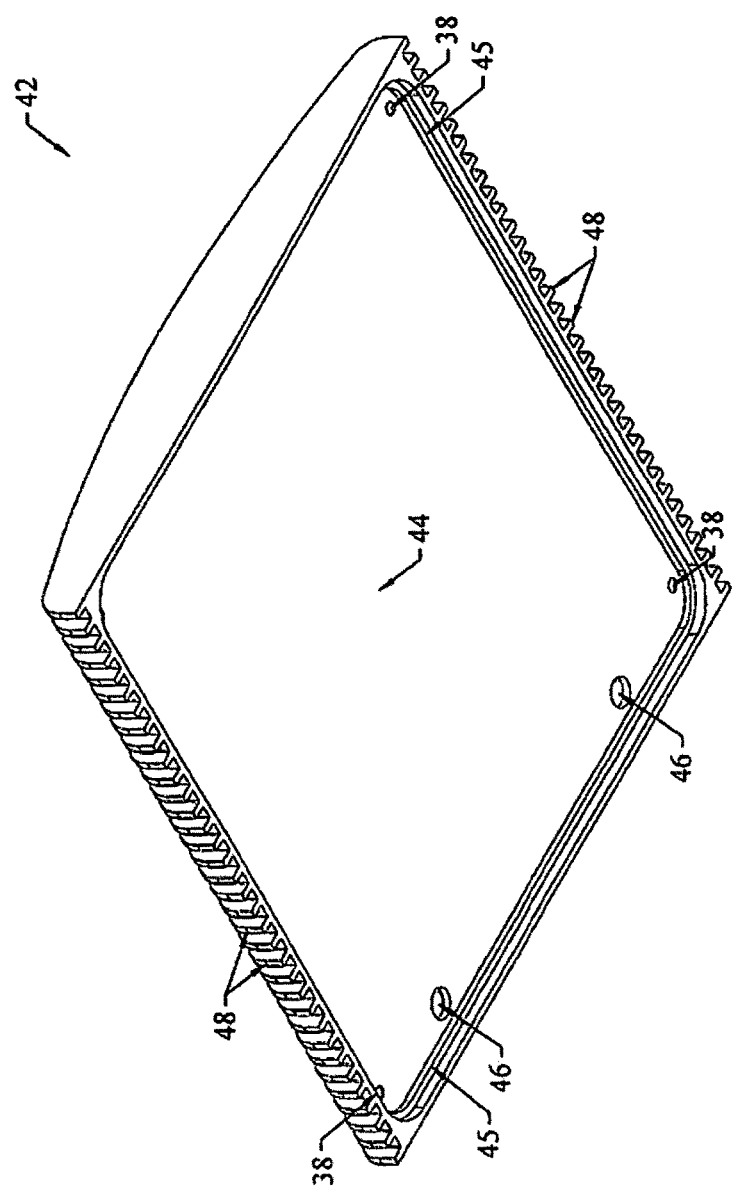
FIG. 4 is a bottom perspective view of components of an embodiment of an intermediate device structure/system in accordance with the present disclosure.

With reference to FIG. 4, embodiments of IDS 10 may further comprise underside surface 44, and essentially the entire housing cover 42, being configured to function as a heat sink for any heat generated by components that may be housed within housing 40. Underside surface 44 may be configured to draw heat out of housing 40 and dissipate that heat away from housing 40 via fins 48 positioned on exterior surfaces of housing 40. In particular, one or more fins 48 may be positioned on the top and side exterior surfaces of housing cover 42. Additionally, fins 48 may be generally uniformly distributed about both a top exterior surface and opposing side surfaces of housing cover 42. A plurality of fins 48 may serve to maximize airflow across housing cover 42 and thereby facilitate effective heat dissipation. Housing cover 42 may further comprise access ports 46 for wired power and data access into and out of the interior of housing 40.

Figure 5:
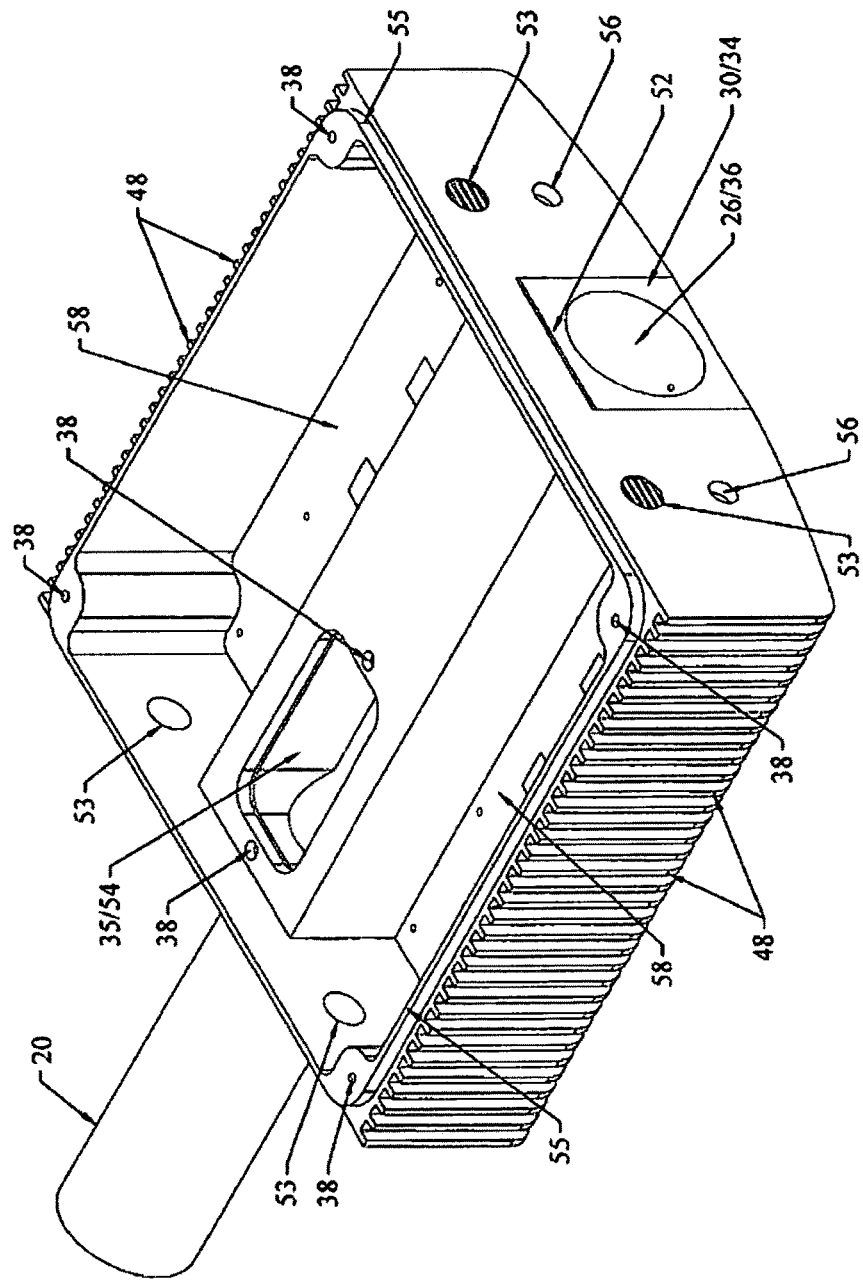
FIG. 5 is a top perspective view of components of an embodiment of an intermediate device structure/system in accordance with the present disclosure.

With reference to FIGS. 3 and 5, embodiments of IDS 10 may further comprise housing body 50 including an internal ridge 52 positioned within an interior cavity 58 defined by housing body 50, as depicted in FIG. 5. However, as viewed from the exterior of housing body 50, internal ridge 52 may appear as an external channel defined in the underside surface of housing body 50. Internal ridge 52, or external channel, depending on the point of view, may be configured to dimensionally correspond to the width W and depth D of base member 30. Indeed, internal ridge 52 may be configured to functionally engage base member 30 and physically couple thereto, such that housing 40 and base member 30 may be releasably and repeatedly coupled to one another. Housing body 50 may be positioned over base member 30, such that internal ridge 52 is positioned proximate base member 30. Once in positional alignment, housing body 50 may be lowered onto base member 30 until internal ridge 52, or external channel, covers base member 30, such that internal ridge 52 functionally and structurally engages base member 30, as depicted in FIG. 5. Once engaged, base member 30 and internal ridge 52 may be coupled together by fastening members, such as screws, bolts, mechanical clasps, friction fit, and/or the like.

Figure 6:
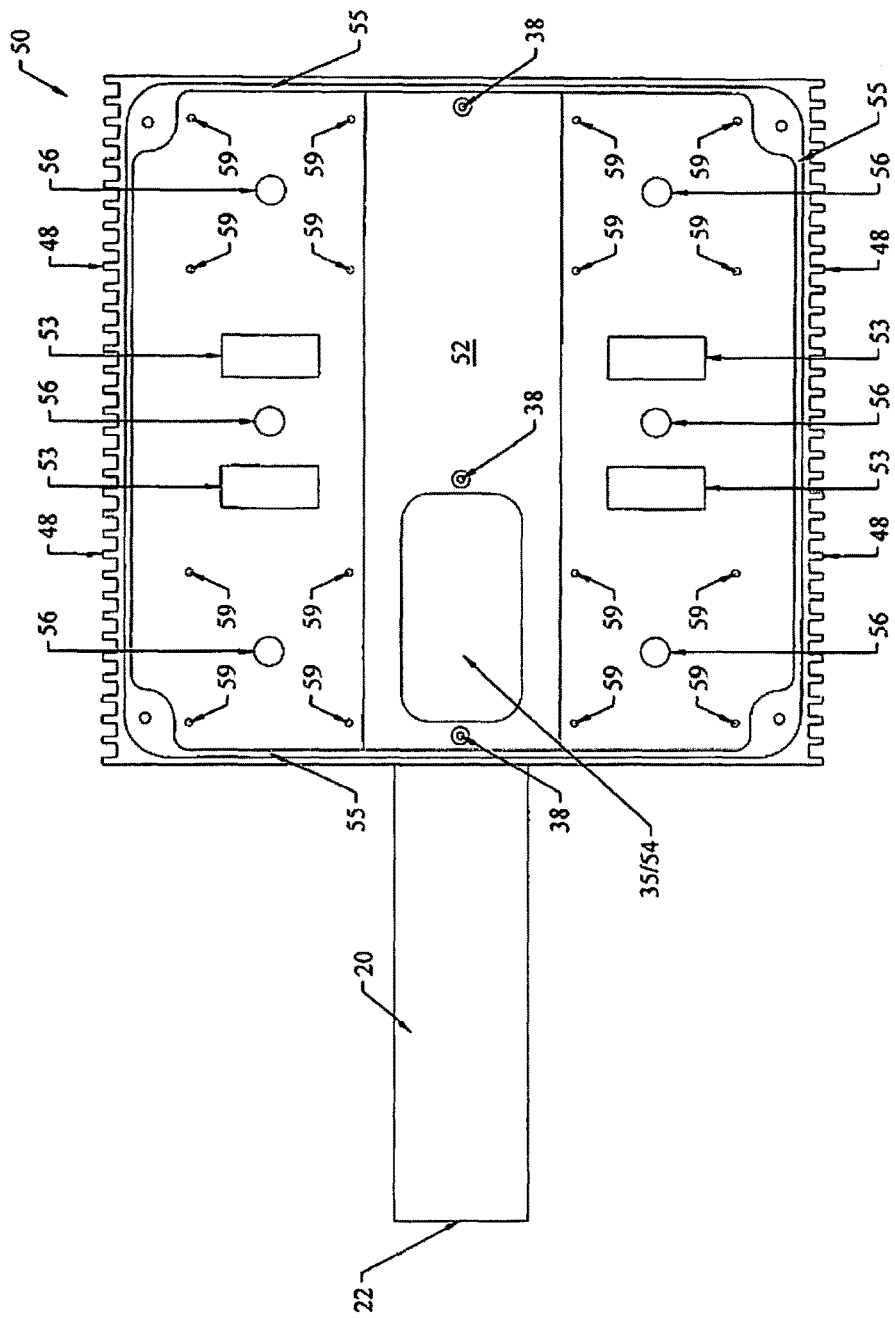
FIG. 6 is a top view of components of an embodiment of an intermediate device structure/system in accordance with the present disclosure.

With reference to FIG. 5, embodiments of IDS 10 may further comprise internal ridge 52 defining one or more internal cavities 58 within housing 40, the one or more cavities 58 being positioned on either side of internal ridge 52. Internal cavities 58 may each be configured to house, support, retain, accommodate, contain, or otherwise hold various electrical components that may provide, for example, power transmission and supply, processing capability, and data connectivity and transmission between devices configured on IDS 10, between neighboring IDSs 10 or other external devices located remotely from IDS 10. Internal ridge 52 may further define an opening 54 in a surface thereof, opening 54 being configured in internal ridge 52 to correspond to and communicate with opening 35 in base member 30. In this way, cavities 58 can be placed in communication with through bores 26 and 36, which benefit will be discussed herein. Housing body 50 may further include access ports 56 for wired power and data access into and out of the interior of housing 40. Access ports 56 may be positioned in side surfaces of housing body 50, as depicted in FIG. 5, and may additionally be positioned in bottom surfaces of housing body 50, as depicted in FIG. 6. Housing body 50 may further comprise coupling ports 59 in bottom surfaces of housing body 50 to facilitate coupling of various electronic accessories to preconfigured receptacles located on the underside surface of housing body 50 and thus to housing 40. Embodiments of IDS 10 may further comprise each preconfigured receptacle having a dedicated access port 56 so that every device coupled to housing 40 at the receptacle may be electrically coupled to housing 40 for power and data connectivity.

Figure 7:
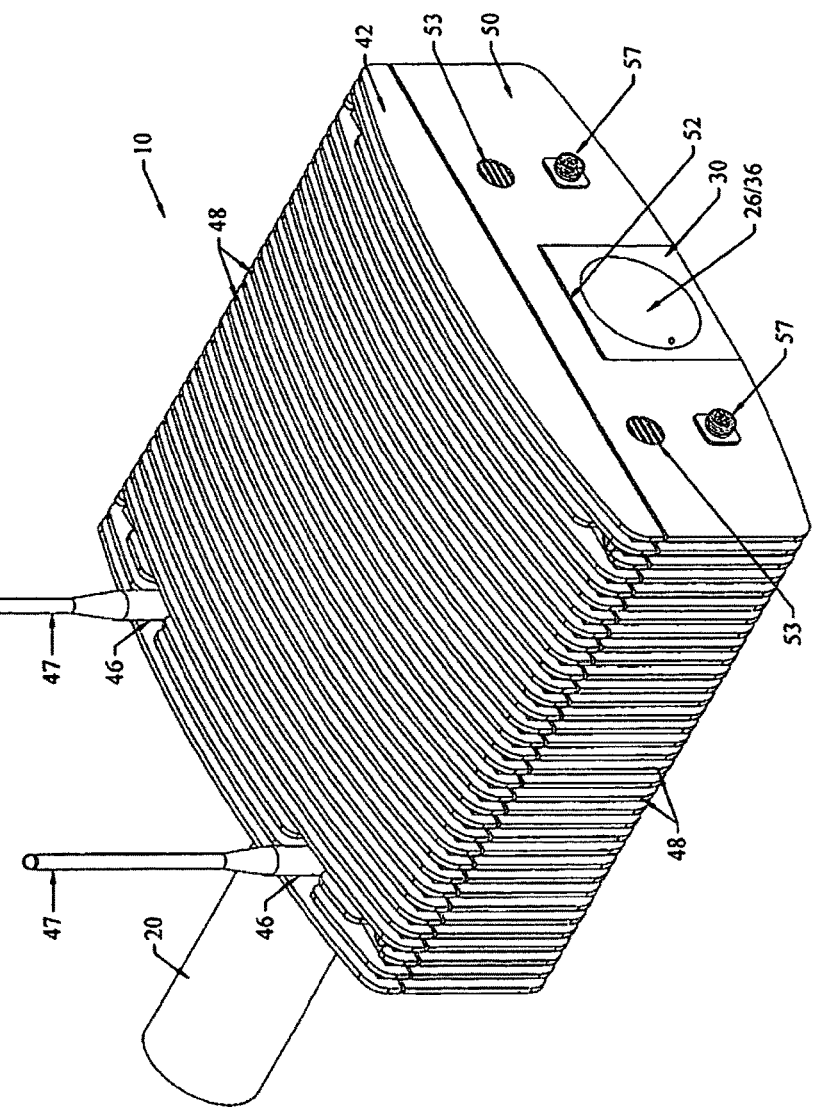
FIG. 7 is a top perspective view of components of an embodiment of an intermediate device structure/system in accordance with the present disclosure.
Figure 8:
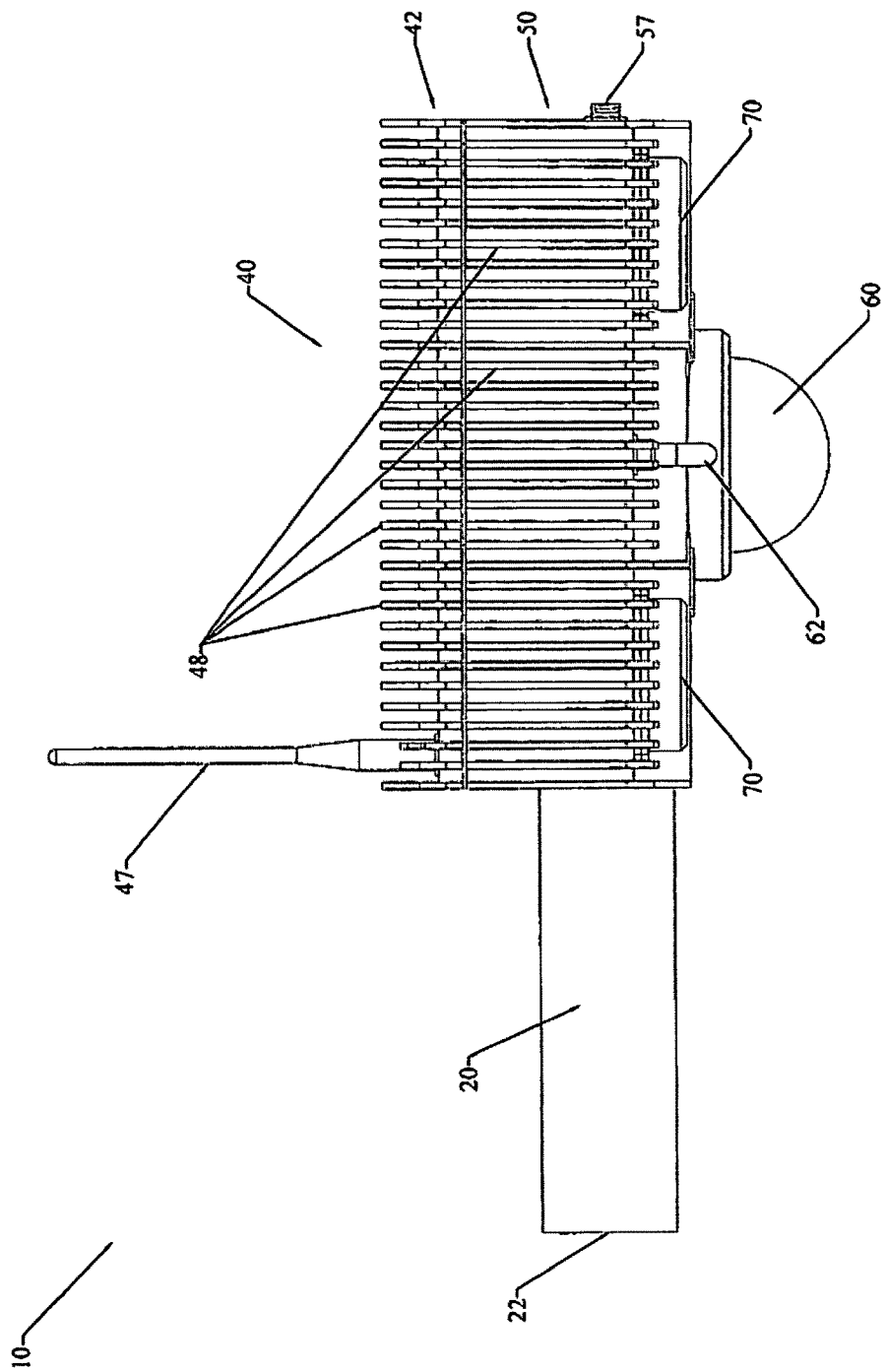
FIG. 8 is a side view of components of an embodiment of an intermediate device structure/system in accordance with the present disclosure.
Figure 9:
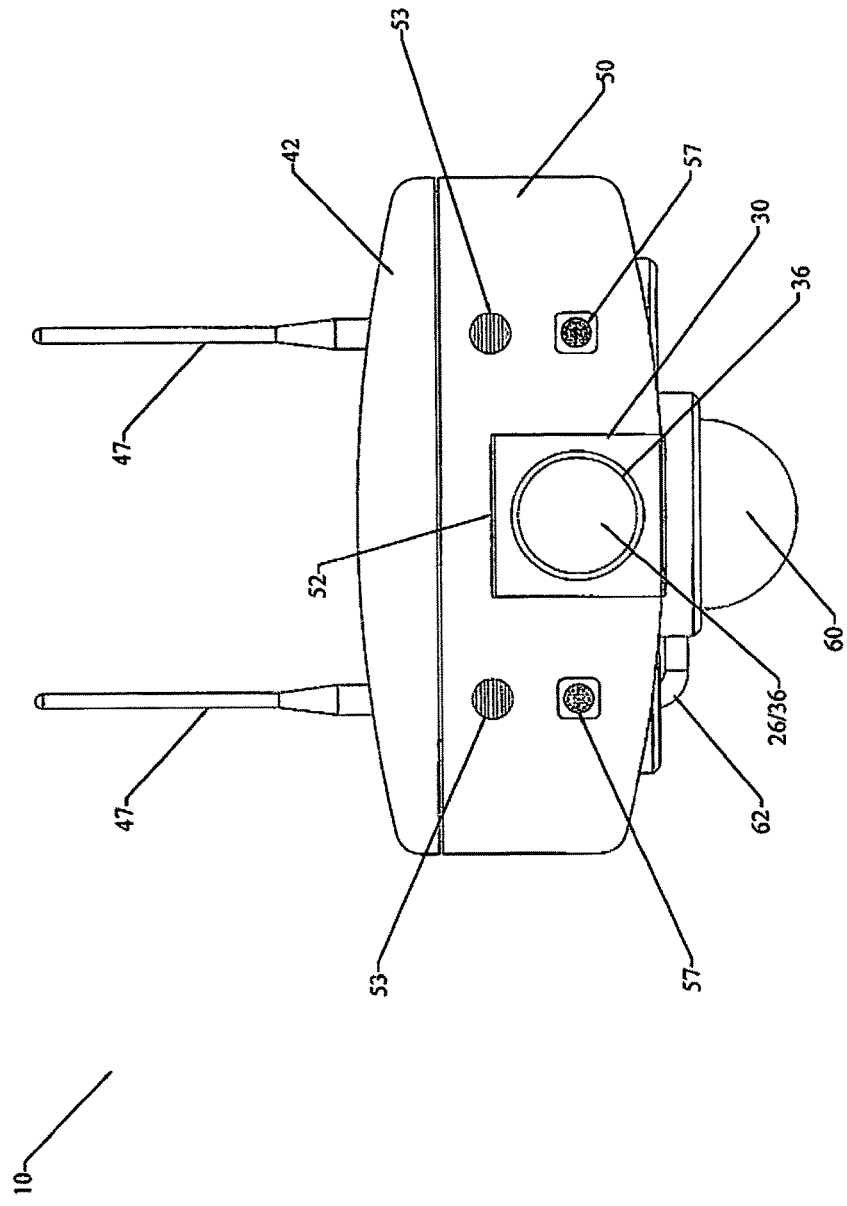
FIG. 9 is a rear view of components of an embodiment of an intermediate device structure/system in accordance with the present disclosure.

With reference to FIGS. 7-9, embodiments of IDS 10 may further comprise housing 40 including one or more preconfigured power and/or data connectivity docks 57 inserted into ports 46/56. Docks 57 may facilitate a quick connect capability of various devices onto housing 40 to become part and portion of IDS 10. Docks 57 may be configured to allow various auxiliary devices to quickly and efficiently establish power and data connectivity to IDS 10. Embodiments of IDS 10 may further comprise one or more antennas 47 coupled to housing 40 on housing cover 42 or housing body 50. As depicted, antenna 47 may be configured to couple to housing cover 42 at port 46. In this way, antenna 47 may extend outwardly from and above housing 40 to efficiently transmit and receive radio waves for communication with other electronic devices as directed according to the particular configuration of IDS 10. Embodiments of IDS 10 may further comprise one or more vents 53. Vents 53 may be configured to permit the flow of air into and out of housing 40. Vents 53 may be configured to provide moistureldust-free air flow in an out of housing 40. In one embodiment, the electronic device may comprise any suitable device or system configured to interact with the IDS 10. The electronic device may be configured to be detachably coupled to the IDS 10. For example, the electronic device may comprise an electronic eye, an illumination device, and/or an auxiliary device 70. The electronic device may be configured to sense/capture a parameter of the its surrounding environment in substantially real-time based on the capabilities and/or limitations of the particular electronic device.

Embodiments of IDS 10 may further comprise a mechanical eye 60, such as a camera or other optical instrument. Mechanical eye 60 may comprise any auxiliary device that may be communicatively coupled to IDS 10 to provide optical image input to IDS 10 and other auxiliary devices coupled thereto. Mechanical eye 60 may be configured to be physically coupled to housing 40 at a lower region of housing 40 or on a bottom surface of housing 40. As depicted, mechanical eye 60 may be configured to be physically coupled to base member 30 on a bottom surface of base member 30. Mechanical eye 60 may be configured to be releasably and repeatedly coupled to housing 40, as needed. Mechanical eye 60 may be configured to couple to dock 57 to facilitate quick and easy connection to power and data connectivity provided through IDS 10.

Figure 10:
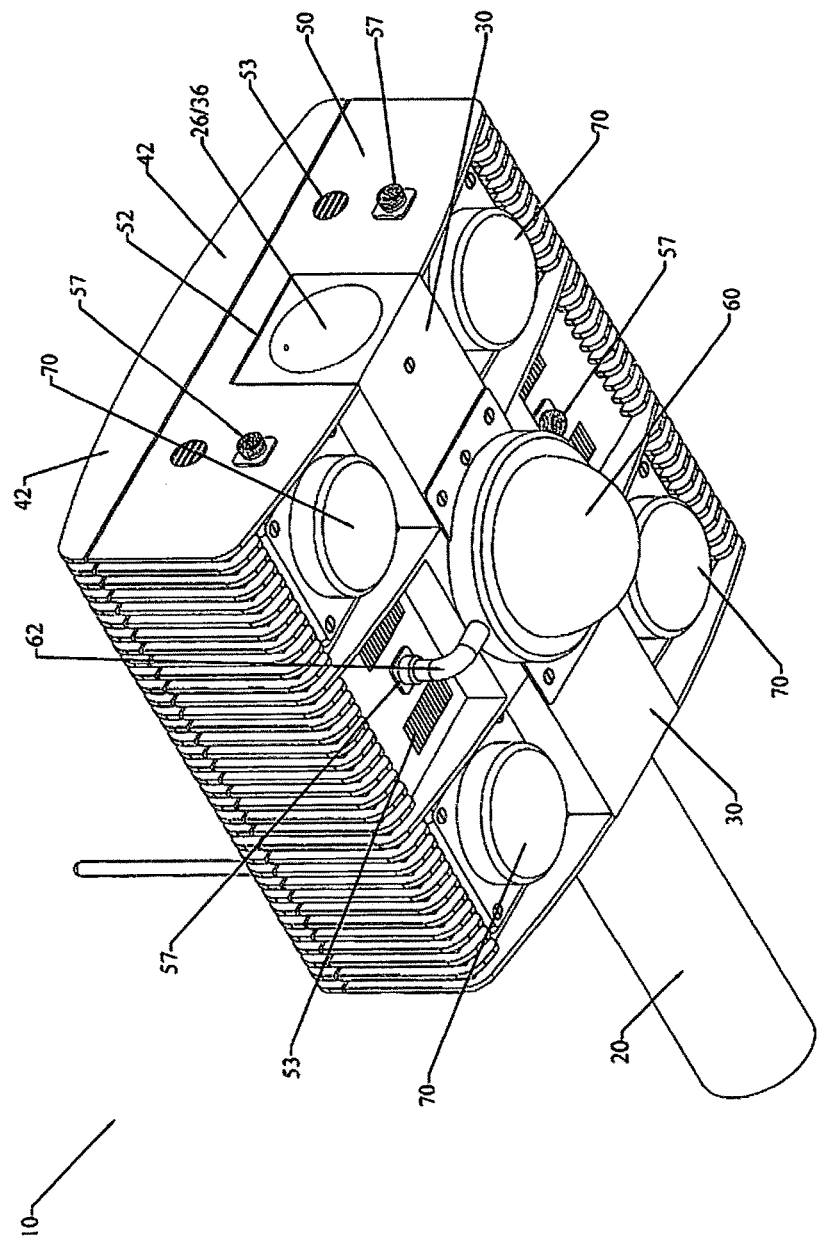
FIG. 10 is a bottom perspective view of components of an embodiment of an intermediate device structure/system in accordance with the present disclosure.
Figure 11:
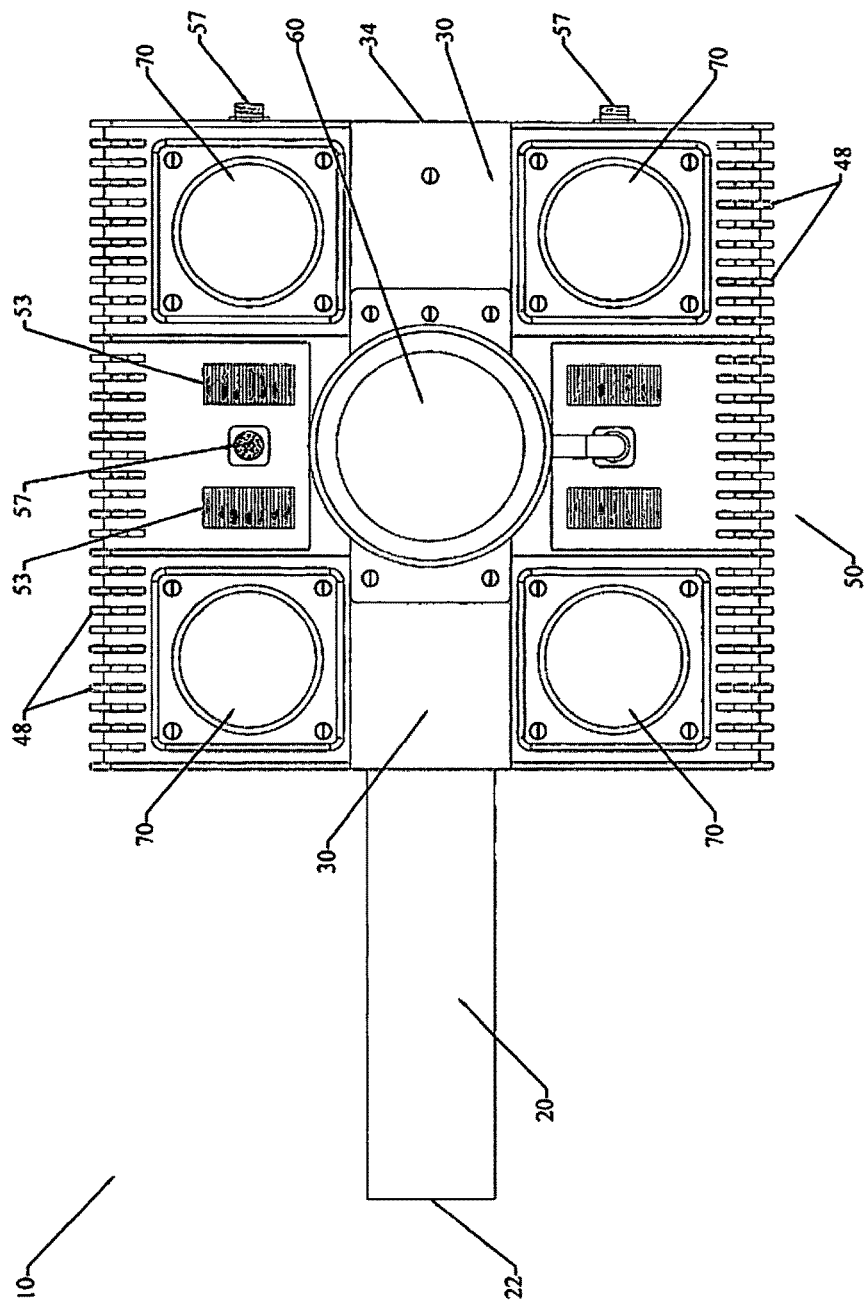
FIG. 11 is a bottom view of components of an embodiment of an intermediate device structure/system in accordance with the present disclosure.

With reference to FIGS. 10 and 11, embodiments of IDS 10 may further comprise one or more auxiliary devices 70. Auxiliary devices 70 may be configured to be physically coupled to housing 40 at a lower region of housing 40 or on a bottom surface of housing 40. Auxiliary devices 70 may also be configured to be releasably and repeatedly coupled to housing 40, as needed. Auxiliary devices 70 may be configured to functionally couple to the lower exterior surface of housing 40 over a port 46. Port 46 may comprise a dock 57 to facilitate quick and easy connection of each auxiliary device 70 to power and data connectivity provided through IDS 10. Alternatively, port 46 may comprise simply an opening through which electrical and data transmission wiring may be passed to facilitate wired connection between auxiliary device 70 and IDS 10 to establish power and data connectivity to the auxiliary device 70 provided through IDS 10. In this way, each auxiliary device 70 may be powered along with IDS 10 and may exchange data therewith and/or with other remotely located electronic devices.

Figure 12:
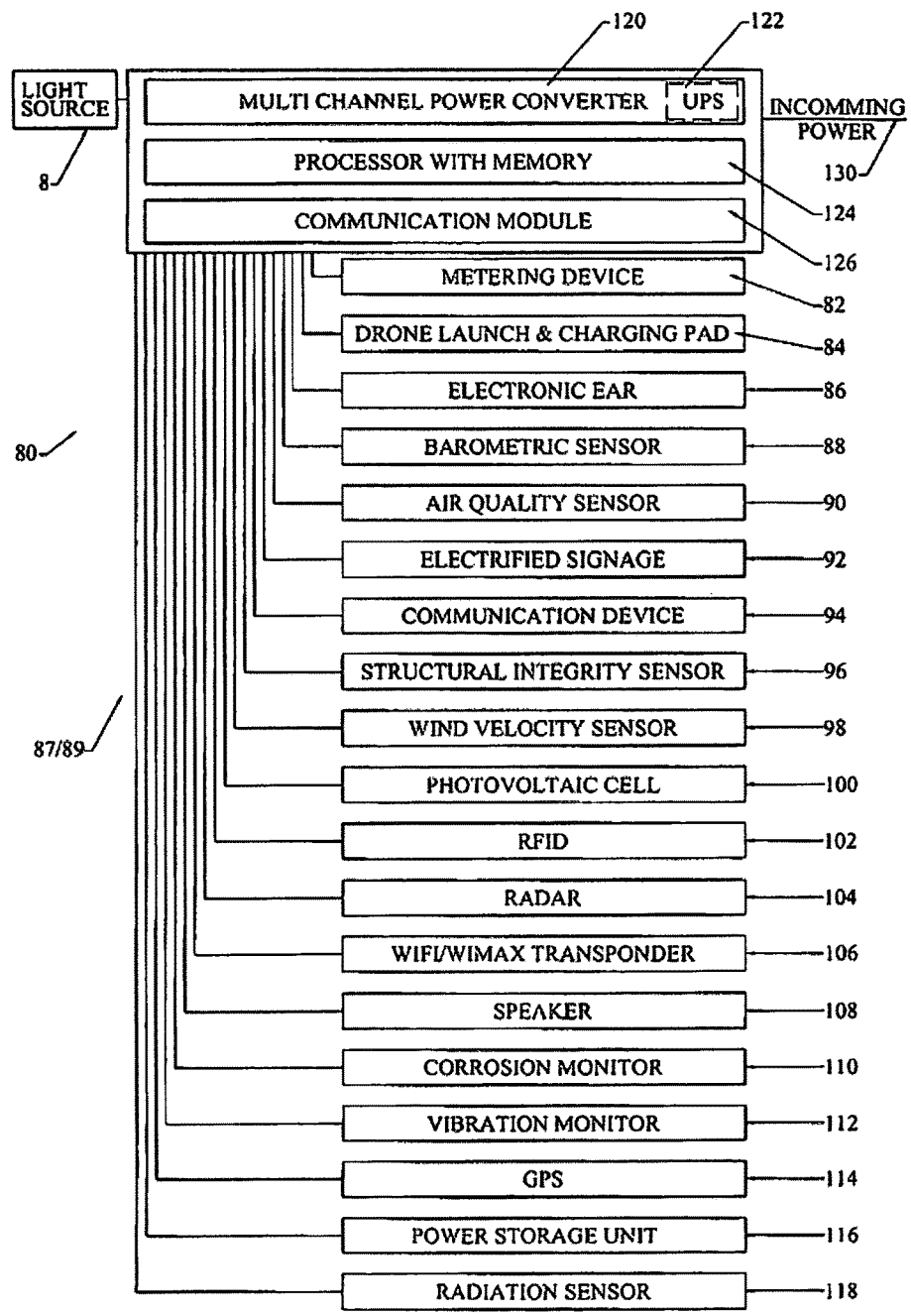
FIG. 12 is a schematic view of components of an embodiment of an intermediate device structure/system in accordance with the present disclosure.

With reference to FIG. 12, embodiments of IDS 10 may further comprise a control unit 80. The control unit 80 may be configured to be communicatively coupled to a processor 124 and a communication module 126. The communication module 126 may be configured to receive and transmit information, data, and/or instructions from a first IDS 10 to a plurality of additional IDS's 10 in substantially real-time. The control unit 80 may be configured to receive and/or process data, information, and/or instructions to trigger an action. For example, the control unit may be configured to operate one or more electrical components of the IDS 10. The processor 124 of the control unit 80 may be configured with sufficient processing power to perform actionable, predictable, and accurate decisions in response to sensed environmental input and/or changes. For example, the control unit 80 may be configured to operate an illumination device on an IDS 10 when an object (such as a person or vehicle) is approaching that particular IDS 10. In some embodiments, the control unit 80 may receive information and/or data related to the speed and direction at which the object is traveling to determine when to operate the illumination device of the second IDS 10.

In one embodiment, the control unit 80 may be configured to create a data set based on the received real-time information from components of the IDS 10, remote clients, remote devices, and/or any other system capable of sending information. The data set may comprise information related to a parameter of the surrounding environment. For example, the data set created by the control unit 80 of one IDS 10 may comprise substantially real-time audiovisual information captured by the camera 60 of that IDS 10. The parameter of the surrounding environment may comprise any suitable parameter captured by any component of the IDS 10 such as an electronic eye (i.e., camera 60), an electronic ear 86, an illumination u e, an auxiliary device 70, a remote client (e.g., a first responder), a remote device (e.g., a cell phone or RFID tag), and/or the like.

The data set may further comprise an instruction set configured to operate the plurality of electronic devices on the IDS 10. For example, the instruction set my comprise instructions for the control unit 80 to operate the illumination source of the IDS 10, to operate the camera 60 of the IDS 10, to send information from one IDS 10 to a plurality of additional IDSs 10, to operate an electronic device located on a different IDS, and/or the like.

The communication module 126 may be configured to form a bidirectional communication channel between the IDS 10 and one or additional IDSs 10. The communication module may further be configured to form a bidirectional communication channel between the IDS 10 and one or more additional electronic devices, remote clients, and/or remote devices. The bidirectional communication channel may be configured to facilitate the transfer of the data set between the control unit of the first IDS 10 and a second communication module 126 of a second IDS 10. The bidirectional communication channel may be configured to allow information and/or data to be sent back and forth between a first IDS 10 to a second IDS 20, between a first IDS 10 and a remote client and/or remote device, and/or between a first IDS 10 and any other system suitably configured to receive information. The bidirectional communication channel may facilitate transfer of information and/or data via hard-wire connections, wireless connections, WIFI, infrared, cellular, and/or the like.

In one embodiment, the bidirectional communication channel may be configured to receive a second incoming data set from a remote client, a remote device, and/or another IDS 10. The second incoming data set may comprise a new set of data/information related to the parameter of the surrounding area as well as a new instruction set configured to operate a plurality of electronic devices on either the IDS receiving the second data set, the remote device, and/or the remote client. For example, the incoming data set may comprise an instruction set instructing the receiving IDS 10 to activate its illumination device.

For example, a first IDS 10 in the network may capture data related to a parameter of the surrounding environment (e.g., traffic conditions). Based on the captured data, the control unit 80 may generate a data set with an instruction set for a second IDS 10 to turn its illumination device on. The data set may be sent from the fist IDS 10 to the second IDS 10 via the bidirectional communication channel. Once received by the second IDS (via its own communication module), the control unit 80 of the second IDS 10 may be configured to execute the instructions included in the instruction set of the data set. The second IDS 10 may use the bidirectional communication channel to send a confirmation back to the first IDS 10. Communication via the bidirectional communication channel between a first IDS 10 and an additional IDS 10, remote client, and/or remote device may be done via radio frequency, WIFI, cellular, hard-wired communication lines, infrared, fiber optics, and/or any other suitable system configured to facilitate the transmission of data/information.

Using the same example above, instead of sending the data set to a second IDS 10, the first IDS 10 may be configured to send the data set to a plurality of additional remote clients and/or remote devices. For example, if the captured parameter of the surrounding environment relates to traffic conditions, the data set may be sent to a remote client such as a first responder with instructions to perform a task. Similarly, the data set may be sent to a cell phone provider with instructions to send alert messages to its customers in the area to avoid a certain location. The data set my also by configured to be sent to a plurality of remote devices located on the pole structure and/or away from the pole structure. A remote device may comprise any device suitably configured to receive information from an IDS 10 such as a cell phone, computer, tablet, GPS unit, and/or the like.

The control unit 80 may be suitably configured to accept and operate a variety of auxiliary devices 70 independently or in unison, wherein each auxiliary device 70 may be configured to sense a parameter of the surrounding environment. For example, mechanical eye 60 may be considered one of several auxiliary devices 70 that control unit 80 can control, manipulate, operate, direct, activate, manage, run, administer, oversee, work, maneuver, or otherwise govern to the benefit of the operational functions of IDS 10 according to programmed parameters, hardware and software capabilities, and sensory input. Mechanical eye 60 may operate to effectively provide an eye into the community, and in particular to the surrounding environments around IDS 10. Mechanical eye 60 may observe, survey, study, and/or monitor surrounding environments and provide a means for remote clients, such as first responders, police, fire and res-cue, EMTs, etc., to view, watch, or otherwise see the happenings and conditions around IDS 10 in real-time. Mechanical eye 60 may be configured to redirect its line-of-sight in 360 degree orientation, such that mechanical eye 60 may provide 360 degree views of the surrounding environment. Mechanical eye 60 may operate by client-directed input received remotely from IDS 10 (i.e., mechanical eye 60 can be operated by users remote from IDS 10), or mechanical eye 60 may operate automatically by pre-programmed instructions that are based on sensory input of other auxiliary devices 70.

Further in example, and not by way of limitation, auxiliary devices 70 may further comprise a metering device 82, a drone launch and/or charging pad 84, an electronic ear 86 (such as a microphone or any system configured to receive audible data and/or information from its surrounding area), a barometric sensor 88, an air quality sensor 90, electrified signage 92, a communication device 94, a structural integrity sensor 96, a wind velocity sensor 98, a photovoltaic cell 100, an RFID reader 102, radar 104, broadband communication hardware 106 (such as WIFI/WiMAX transponders, transceivers, and other communication gear; 3G and 4G communication gear), a speaker 108, a corrosion monitor 110, a vibration monitor 112 (such as a piezoelectric sensor), GPS technology 114, power storage unit 116 (such as a battery or backup power unit), and a radiation sensor 118 (such as a high-energy particle detector). RFID reader 102 may further comprise any other signal reader that is capable of reading and/or receiving a signal being broadcast by a RFID tag within the sensing range of the RFID reader 102. These auxiliary devices 70 listed herein may not be considered to be all inclusive0. That is, the auxiliary devices 70 listed herein may additionally include other community system and monitoring devices and circuits not listed herein. For example, auxiliary devices 70 may further comprise seasonal lighting displays, long-term and short-term electrified signage, astronomical clock for keeping and tracking time, a thermometer of any variety for measuring one or more temperatures, one or more photocells, and one or more infrared sensors (such as motion sensors), each of these being configured to be electrically coupled to IDS 10 and configured to be controlled thereby. Control unit 80 may be housed in housing 40, such as within cavity 58. Auxiliary devices 70 may be housed in housing 40, such as in cavity 58, and may alternatively be coupled housing 40 on an exterior portion thereof, as described herein.

In one embodiment, the auxiliary devices 70 may be suitably configured with any system configured to allow a first auxiliary device 70 to communicate with a second auxiliary device 70. The auxiliary device 70 of a first IDS 10 may be configured to communicate with one or more auxiliary devices 70 of one or more additional IDS 10. For example, the electronic eye (i.e., camera 60) of one IDS 10 may receive sensed information of its surrounding area, and may associate this information with the specific IDS 10 on which the camera 60 is mounted/housed. The first IDS 10 may send the sensed information from the camera 60 of the first IDS 10 to any number of additional IDS 10 such that the additional IDS 10 also has access to the same sensed information as the first IDS 10. For example, the control unit 80 of the first IDS 10 may transmit/send the sensed information from the camera 60 of the first IDS 10 via the communication module 126 to the communication module 126 of the second IDS 10, wherein the information is passed to the control unit 80 for further processing. This cycle may be repeated at each of the individual IDSs 10 receiving the sensed data/information from the camera 60 of the first IDS 10.

Embodiments of drone launch and charging pad 84 may comprise a drone being configured on IDS 10. The drone may refer to any suitable unmanned aerial vehicle (UAV). As information from the network of IDSs 10 is relayed between the individual IDSs 10, the IDS 10 equipped with drone launch and charging pad 84 may be configured to instruct the drone to launch and travel to a particular destination, such as another IDS 10, a vehicle accident location/area, vehicle emergency location/area, high-speed chase, crowd control, community emergency, or other event, and provide aerial views in substantially real-time. These views/images may be relayed from the drone to nearby IDS 10 or to other remote electronic devices or clients. In one embodiment, the drone may transmit information from itself to the closest IDS 10, and that IDS 10 may then forward that information to one or more additional IDSs 10 and/or remote devices and or remote clients. For example, if a drone is launched to the location/area of an on-going public emergency, the drone may transmit real-time images and/or video of the emergency to an IDS 10, a first responder unit such as law enforcement, fire control, and/or health responders, or to a remote electronic device such as all cellular phones within a certain distance radius. After the drone has completed its assigned task, or if the drone requires recharging, the drone may return to its IDS 10 (or any other local IDS 10 configured with a drone launching and charging pad 84) and land to recharge its batteries on drone launch and charging pad 84. The drone may also be configured to operate in reconnaissance mode without specific instructions or assignments to carry out. For example, the drone may be configured to automatically take-off from the launch pad 84 and survey a predetermined area, capture information related to that area (e.g., images and/or video) and relay that information back to the IDS 10 and its network. Drone launch and charging pad 84 may be configured to be charged by power being routed through one or more power supply modules and distribution networks, to be discussed herein.

Auxiliary devices 70 may be optimized to provide a broader platform for a larger number of auxiliary devices 70 with greater interactive capabilities. Thus, in a general sense, control unit 80 may be considered the heart and mind of IDS 10, the structural components, such as coupling arm 20, base member 30, and housing 40 may be considered the skeletal support of IDS 10, and auxiliary devices 70 may be considered the muscle and sensory input of IDS 10. For example, coupling arm 20, base member 30, and housing 40 may pro-vide a physical platform in conjunction with pole 4, and in particular mast arm 6, on which IDS 10 may be positioned for optimal benefit to the community in the performance of its intended functions. Further in example, auxiliary devices 70 may gather information of the surrounding environment around IDS 10 and relay this information to control unit 80 for processing. Control unit 80 may then provide directives, instructions, or commands to IDS 10 for further sensory gathering operations, to the surrounding environment in the form of direct and immediate audible or visible alerts, or to remote devices or clients positioned at a short or great distance from IDS 10. Each IDS 10 may also form part of a larger network of IDSs 10. Taken together, the network of IDSs 10 may be configured to operate together in unison to provide a larger-scale view of conditions in a community or along a roadway in real-time. Communications hardware and wiring may comprise electrical wiring, broadband communication cable, fiber optic cable, category 5 cable, network cable, twisted pair cable, or other similar wiring and cable that is configured to carry, transmit, and otherwise support electricity, power, data exchange, and/or the like.

In one embodiment, the network of 1DSs 10 may be autonomous and decentralized. The IDS 10 may be autonomous in that the IDS 10 may be configured to operate independently from human control based on a parameter of a local environment, received information from other IDS 10, remote devices, and/or remote clients, and the like. For example, based on the light levels captured by a camera 60, the IDS 10 may be configured to automatically operate the illumination device. The network of IDSs 10 may also be configured to operate in a decentralized fashion. For example, a single IDS 10 may be configured to relay and/or transmit information from itself to one or more additional IDS 10, remote clients, and/or remote devices without first transmitting that information to a centralized server. In this configuration, the network of EDSs may be configured to operate more efficiently and provide information at a higher speed than if the information needs to be routed through a centralized server first.

Figure 18A:
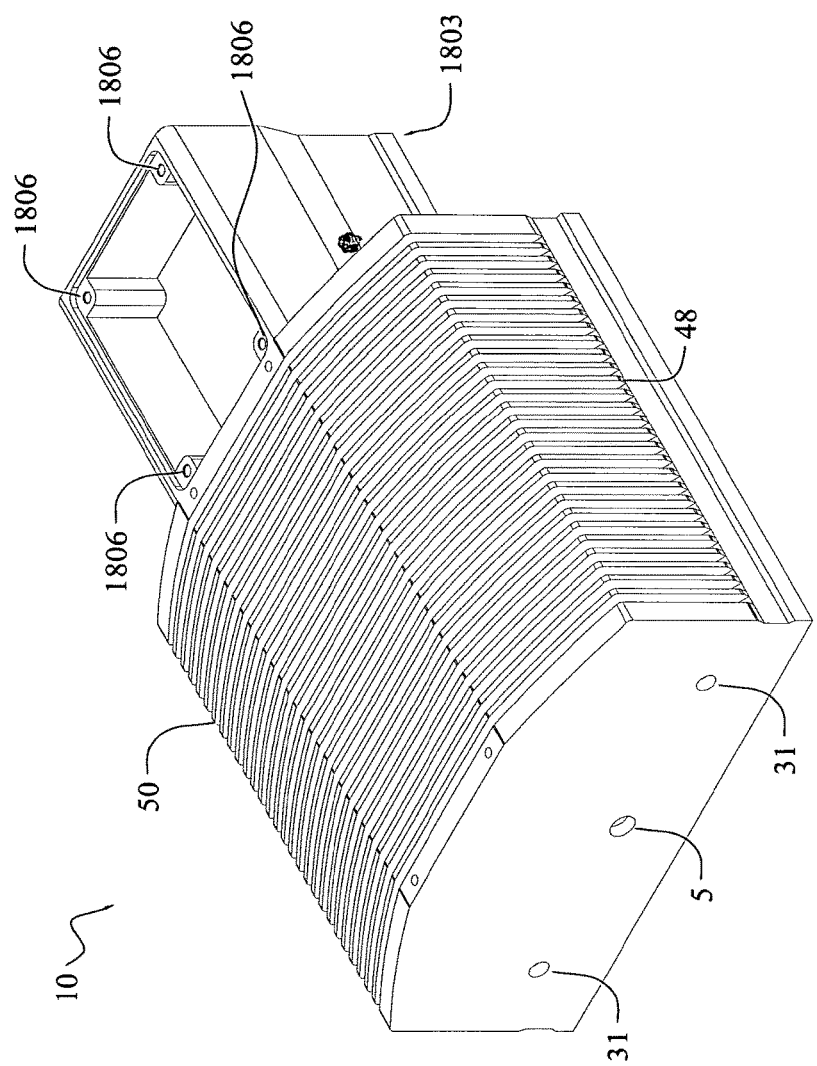
FIG. 18A is a top view of an different embodiment of the intermediate device structure/system in accordance with the present disclosure.

Now referring to FIGS. 18A, B, and D, in another embodiment of the present technology, the IDS 10 may comprise an upper section 1801 and a lower section 1802. The upper section 1801 and lower section 1801 may be detachably coupled together to form a cavity 58 in which additional components of the IDS 10 may be housed such as a mechanical eye (i.e., camera 60), mechanical ear (not shown), and the like as discussed above.

In one embodiment, the upper section 1801 and the lower section 1802 may be detachably coupled together with any suitable fastener such as a hinge 41. For example, the upper section 1801 may comprise a first hinge portion 1810 for receiving a second hinge portion 1815 of the hinge 41, wherein the second hinge portion 1815 is disposed on the lower section 1802. The first hinge portion 1810 and the second hinge portion 1815 may joined by automatically lock in place or may be manually locked in place. When the first hinge portion 1810 and the second hinge portion 1815 are couple together, the interior of the IDS 10 may be accessed by dissociation of the lower section and engagement of the hinge 41, as described below.

Now referring to FIGS. 18-20 and 25-26, in one embodiment, the upper section 1801 may comprise a pole attachment system 1803 for receiving and coupling to an existing infrastructure system such as a light pole 4 The pole attachment system 1803 may be coupled to the upper section 1801 with any suitable fastener (not shown) such as bolts, adhesives, magnets, and the like. In various embodiments, the fastener may have suitable strength and/or resilience to maintain the structural integrity of the IDS 10 in adverse weather and/or erosion conditions. In some embodiments, the attachment system 1803 may be an integral portion of the upper section 1801 of the IDS 10. For example, during a molding process, the attachment system 1803and the upper section 1801 may be formed together using a single molding piece.

Referring to FIGS. 18B-E, in one embodiment, the attachment system 1803 may comprise a suitably shaped structure forming a mast attachment cavity 1804 for receiving the mast arm 6 (not shown) of the light pole 4 (not shown). In some embodiments, the attachment system 1803 and/or the mast attachment cavity 1804 may comprise a shape substantially similar to the mast arm 6. For example, the attachment system 1803 and/or the mast attachment cavity 1804 may be formed in a substantially rectangular shape to fit the mast arm 6 having a cross-section that is substantially rectangular. In some embodiments, a mast arm attachment plate 1805 may be disposed within the mast attachment cavity 1804. In various embodiments, the mast arm attachment plate 1805 may be coupled to the attachment system 1803 using any suitable method or device, such as bolts, screws, adhesives, and the like.

In one embodiment, sidewalls 1820 of the attachment system 1803 may be configured to suitably fit around an existing light pole. For example, the sidewalls 1820 may be curved to fit a rounded light pole mast, or the sidewalls 1820 may be substantially straight to fit around a square or other suitably shaped light pole mast. A pair of opposing sidewalls 1820 of the attachment system 1803 may comprise a mast track 9 configured to fit around an existing light pole mast as shown in FIGS. 19-20 and 25-26.

Figure 18B:
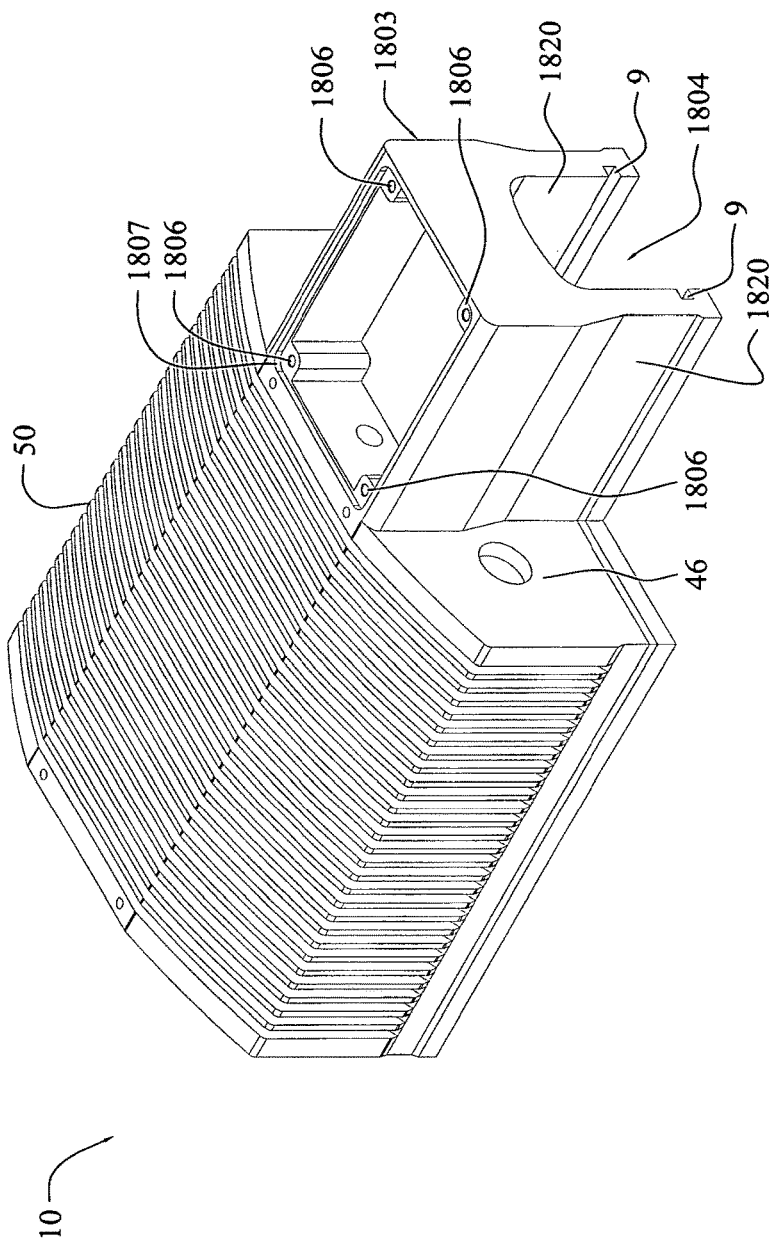
FIG. 18B is a different angle top view of the different embodiment of the intermediate device structure/system in accordance with the present disclosure.
Figure 18C:
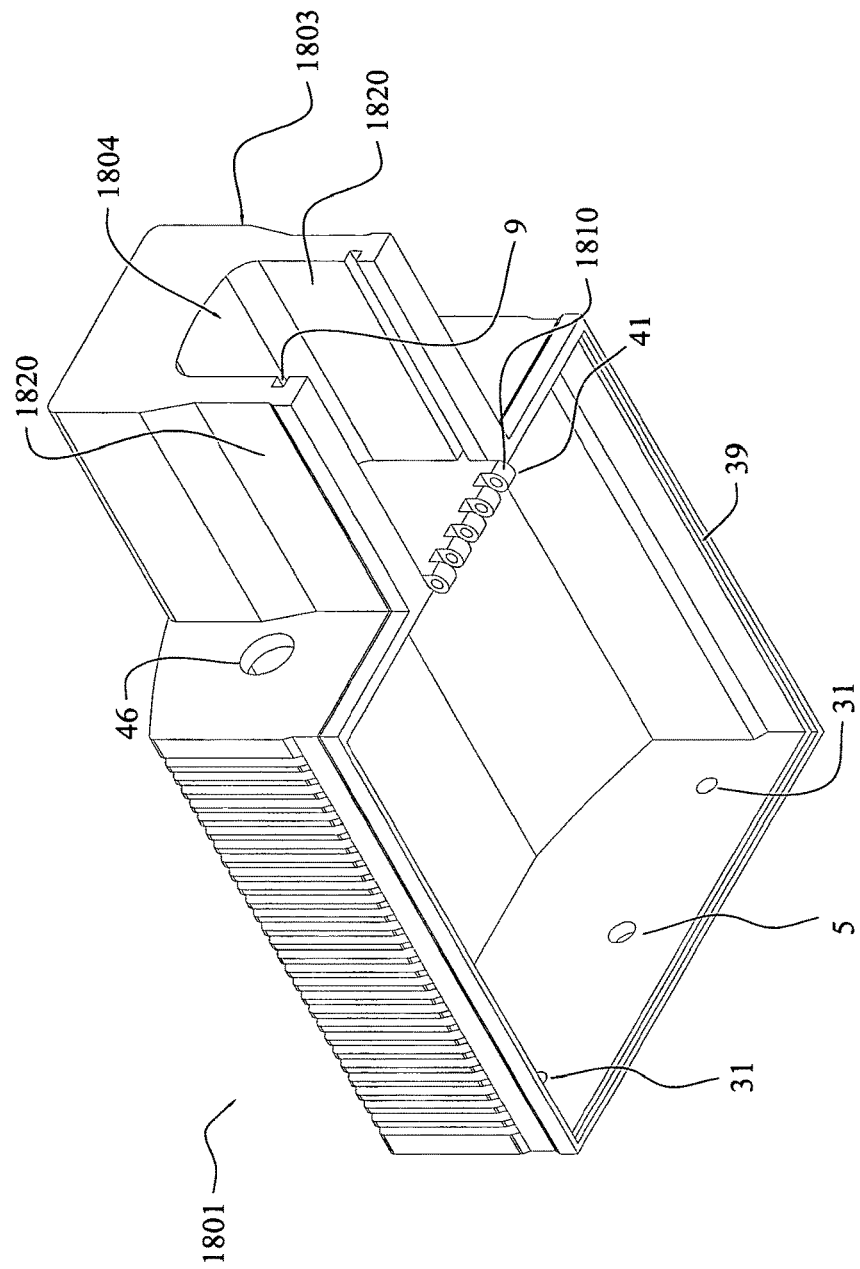
FIG. 18C is a bottom view of the upper section of the different embodiment of the intermediate device structure/system in accordance with the present disclosure.

Referring to FIGS. 18A, B, D, E, H, and I, in one embodiment, the sidewalls 1820 of the pole attachment system 1803 may be configured with any suitable system or device to mount a landing pad 84 for receiving and/or recharging the drone. For example, the sidewalls 1820 may comprise a series of mounting bores 1806 configured to receive the landing pad 84. The landing pad 84 may be configured to be secured to the pole attachment system 1803 via the mounting bores 1806 as shown in FIGS. 18A and 18E. The mounting bores 1806 may be configured to terminate at a height lower than that of the upper section 1801 resulting in the formation of a lip 1807. The lip 1807 may be configured to receive the landing pad 84 such that the landing pad sits below the height of the upper section 1801 on the lip 1807.

In one embodiment, the attachment system 1803 may comprise a powerentry port 1808. The power entry port 1808 may be configured to receive a power source from an existing structure such as a light pole. The power entry port 1808 may comprise two substantially equally sized holes on the attachment system 1803 as well as the housing body 50 as shown in FIG. 18B.

In one embodiment, the upper surface of the attachment system 1803 may be suitably configured to receive a landing pad 84 for the drone. The landing pad 84 may be configured to receive, hold, and/or recharge the drone. For example, the landing pad 84 may be communicatively coupled to the control unit 80 of the IDS 10 as well as the power module of the IDS 10. The landing pad 84 may comprise electrical contacts to interact with the charging port of an UAV such that when the UAV is on the landing pad 84. The landing pad 84 may charge the UAV using electrical power form the power supply of the IDS 10.

In one embodiment, the landing pad 84 may comprise the same structure as the attachment system 1803, or the landing pad 84 may comprise a separate component that is coupled to the attachment system 1803 at a later time. The landing pad 84 may be detachably coupled to the attachment system 1803 using any suitable method such as screws, bolts, adhesives, magnets, and/or the like. The size of the landing pad 84 may vary depending on the size of the UAV for which the landing pad 84 is configured for.

Now referring to FIG. 18E, in one embodiment, the landing pad 84 may comprise a series of attachment points 1808. The attachment points 1808 of the landing pad 84 may be configured to match up with the mounting bores 1806 of the attachment system 1803. Any suitable system or device may be configured to secure the landing pad 84 to the mounting bores 1806 such as bolts, screws, adhesives, and the like.

Now referring back to FIGS. 18A-E, the upper section 1801 of the IDS 10 may be configured with a system suitably configured to dissipate heat away from the IDS 10. The IDS 10 may be configured to draw heat out of housing body 50 and dissipate that heat away from the housing body 50 via the heat fins 48 disposed on the exterior surfaces of housing body 50. For example, one or more heat fins 48 may be positioned on the top and side exterior surfaces of the upper section 1801. Additionally, heat fins 48 may be generally uniformly distributed about both a top exterior surface and opposing side surfaces of upper section 1801. A plurality of heat fins 48 may serve to maximize airflow across upper section 1801 and thereby facilitate effective heat dissipation.

The upper section 1801 may further be configured with a plurality of access ports configured to grant access to the interior of the housing body 50. The access ports may comprise an electrical wiring port 5 and antenna port 46. The electrical wiring port 5 ports may be configured to receive electrical power lines from an exterior source. The antenna port 46 may be configured to receive auxiliary devices such as antennas, and/or receive additional components of the IDS. The access ports may vary in size depending on the type of component being passed through and/or attached.

Figure 18D:
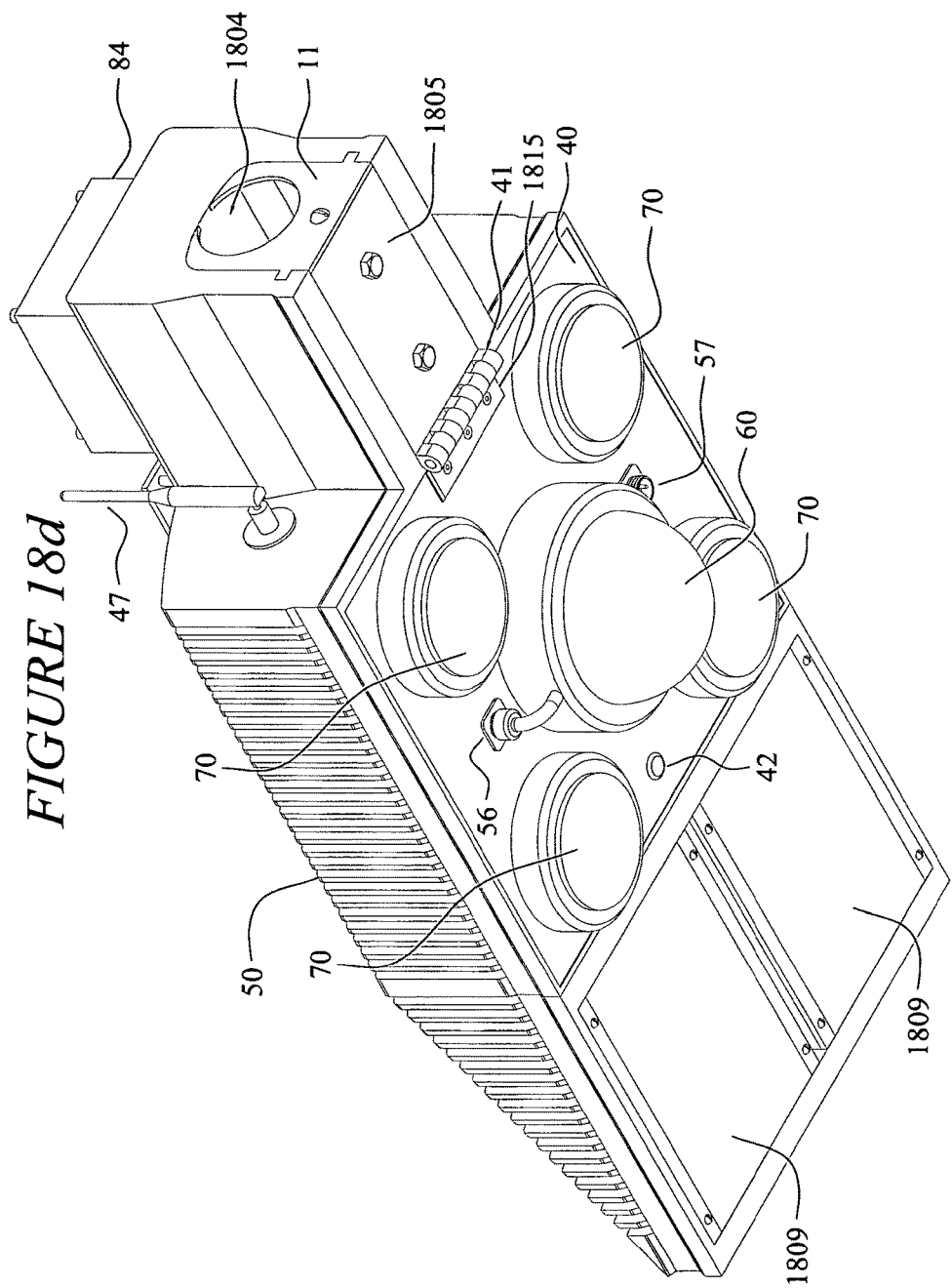
FIG. 18D is a bottom view of the upper section coupled to the lower section of the different embodiment of the intermediate device structure/system in accordance with the present disclosure.
Figure 18E:
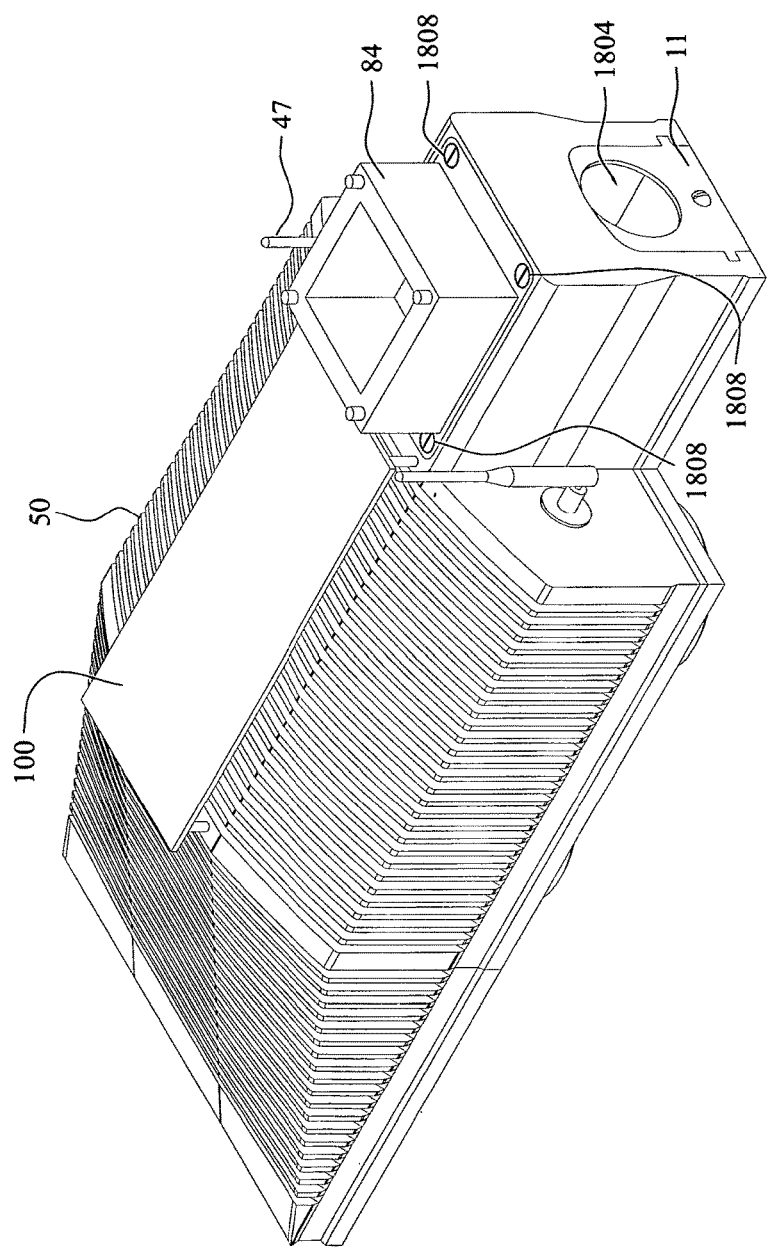
FIG. 18E is a top view of the different embodiment of the intermediate device structure/system with a photovoltaic cell and landing pad in accordance with the present disclosure.
Figure 18F:
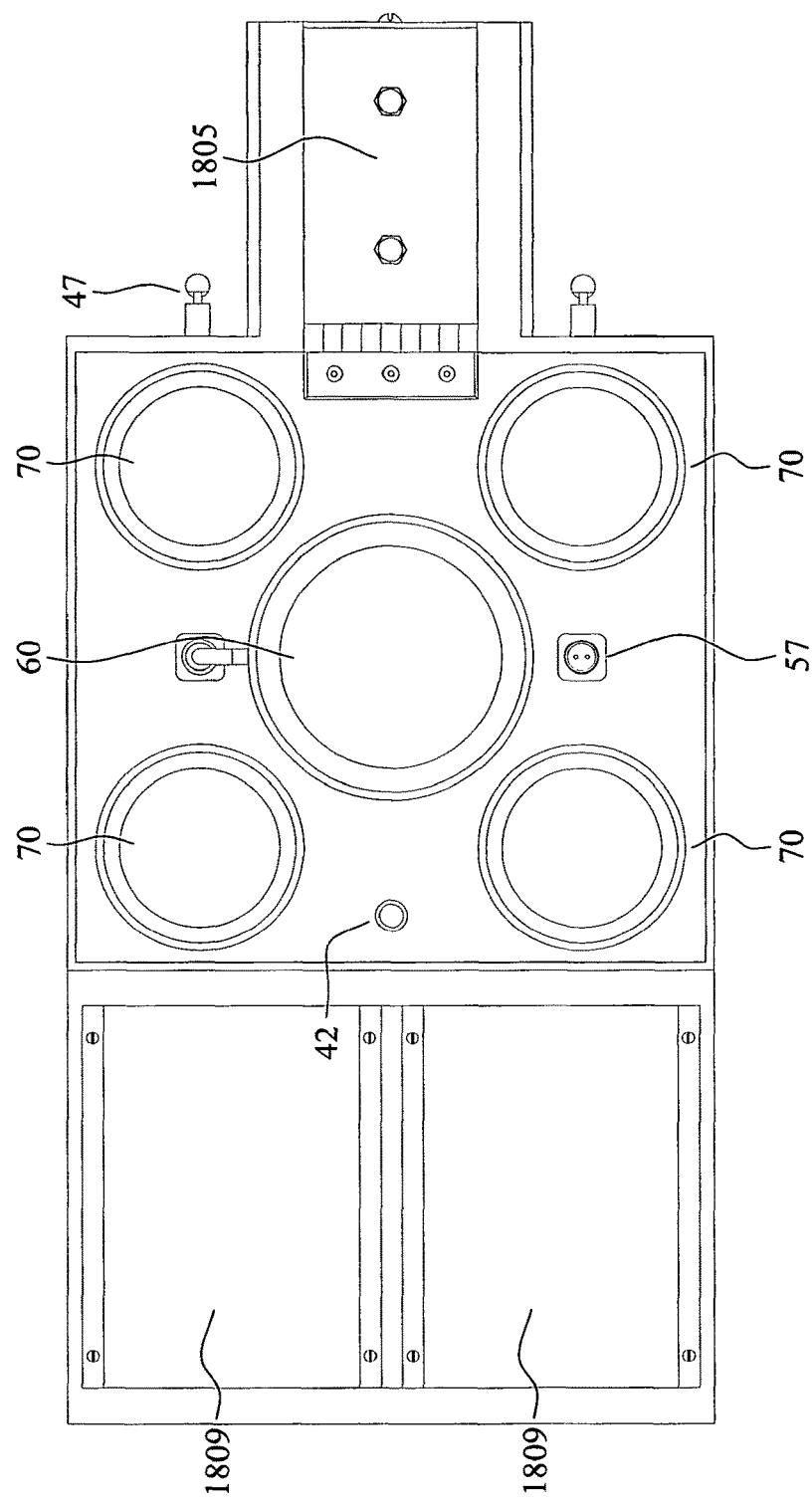
FIG. 18F is a bottom view of the lower section of the different embodiment of the intermediate device structure/system in accordance with the present disclosure.
Figure 18H:
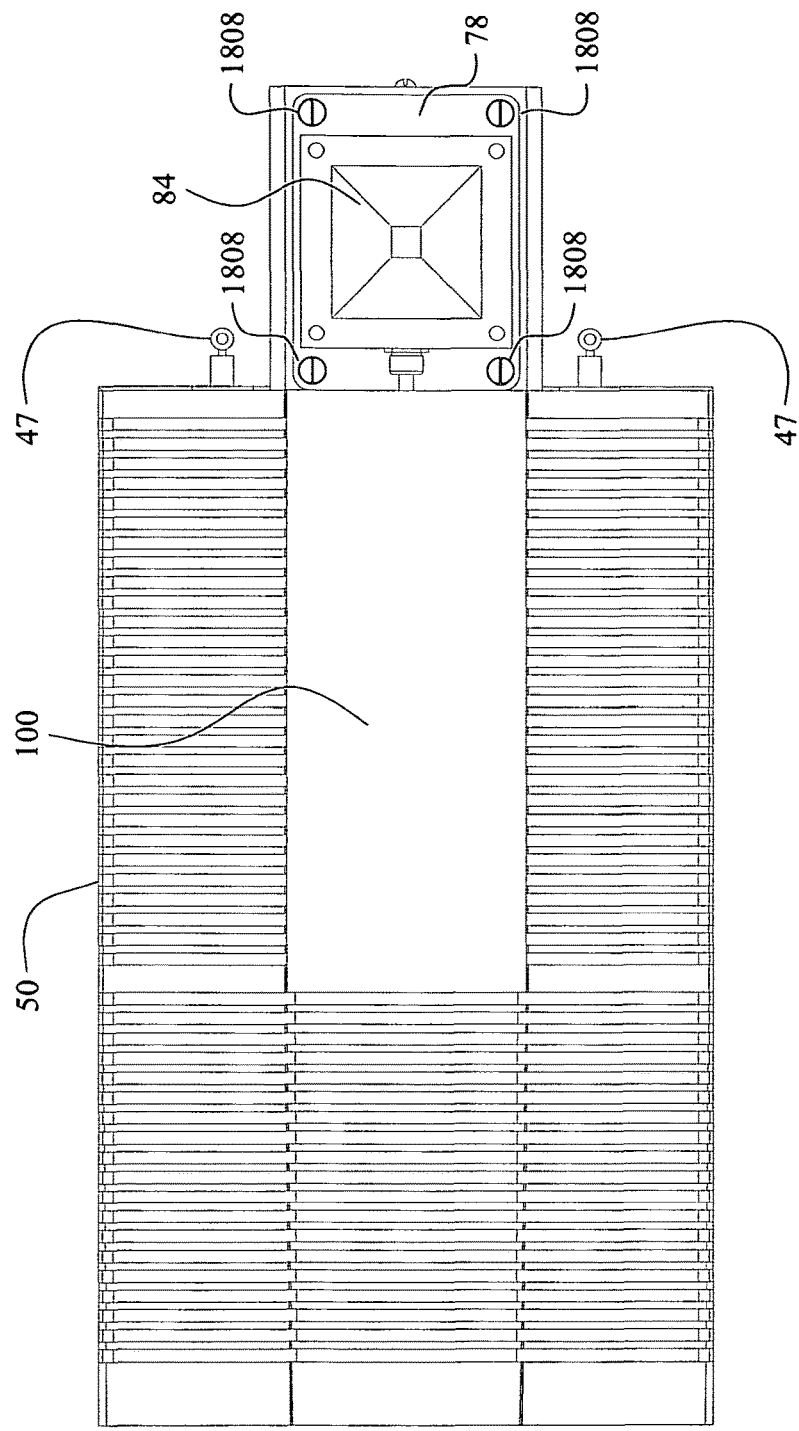
FIG. 18H is a top view of the different embodiment of the intermediate device structure/system in accordance with the present disclosure.
Figure 19:
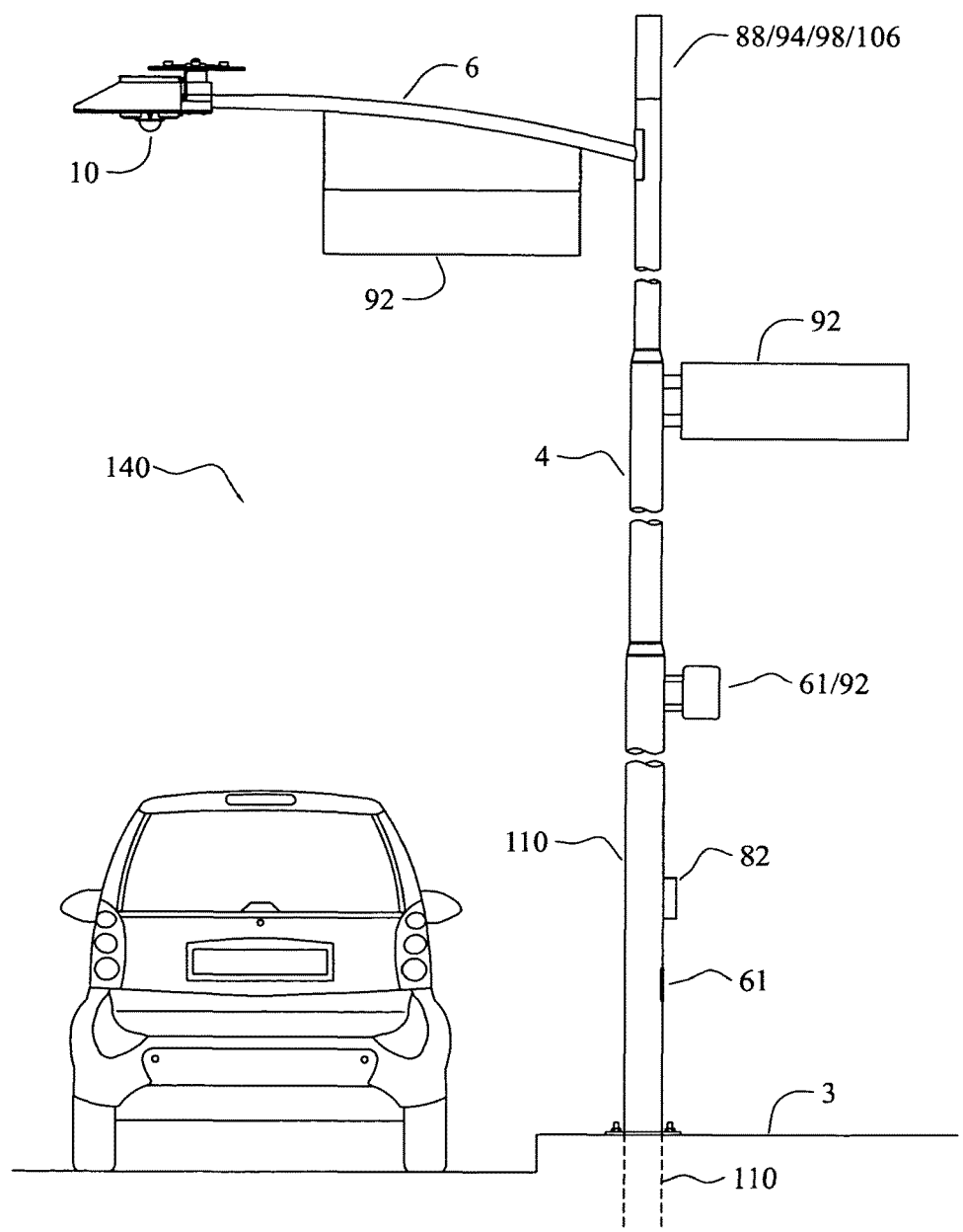
FIG. 19 is a side view of the different embodiment of the intermediate device structure/system coupled to an existing illumination pole in accordance with the present disclosure.

Now referring to FIGS. 18D-F, in one embodiment, the lower section 1802 may be configured to house a plurality of devices and/or auxiliary systems 70. The devices and auxiliary systems 70 may be attached to the lower section 1802 such that one portion protrudes outward from the lower section 1802 while another portion resides in the housing body 50. For example, a camera 60 may be attached to the lower section 1802 such that the camera portion of the camera 60 protrudes outwardly from the lower section while the portion of the camera 60 that requires electrical power is positioned within the housing body 50 such that the necessary electrical connections may be made.

In one embodiment, the lower section 1802 may be configured with an access button configured to grant access to the cavity 58 of the housing body 50. For example, an access button 42 may be disposed on the lower section 1802 and suitably configured to open an access door 40 utilizing the hinge system 41. The access button 42 may be configured to release the hinge system 41 such that access o the interior of the housing body 50 is granted.

In one embodiment, the lower section 1802 may comprise a dedicated access port 56 and/or a power and data port 57. The dedicated access port 56 and/or the power and data port 57 may be configured to receive electrical power from the power supply of the IDS 10 and pass that power to one of the IDS' 10 electrical components. For example, camera 60 may be coupled to the dedicated access port 56 to receive electrical power to operate the camera 60. The power and data port 57 may be configured to provide electrical power and/or data lines for the camera 60 as well as any additional auxiliary devices 70 as discussed above.

The lower section 1802 may further comprise a light source 1809. The light source may comprise any suitable system or device configured to provide illumination to its surrounding area. The light source 1809 may receive electrical power from the IDS 10. For example, the light source 1809 may be electrically coupled to the power supply of the IDS such that electrical power may be transmitted to the light source 1809. The light source 1809 may further be communicatively coupled to the control unit 80 of the IDS. The light source 1809 may be configured to receive information, data, and/or instructions from the control unit to operate the light source 1809. For example, the control unit may send instructions to the light source 1809 to turn on and off depending on the received information from one of the electrical components of the IDS 10.

Control unit 80 may further comprise operating components within cavity 58 of housing 40 of IDS 10, the operating components may include one or more power supply modules 120, one or more processors 124 with associated memory 125, and one or more communication modules 126 that direct I/O operations of IDS 10. Power supply module 120 may include a power converter and distribution module. Control unit 80 may further comprise long-term data storage 128, such as a hard drive, solid state drive, or other data storage device. Each of the individual components of control unit 80, including for example, power supply module 120, processor 124, RAM memory 125, communication module 126, data storage 128, and auxiliary devices 80, may each be suitably connected via a power bus 87 and a data bus 89 (represented as solid lines). Control unit 80 and its associated component parts and wiring may be referred to as an electronic assembly.

Embodiments of IDS 10 may comprise power supply 120 being a power supply and distribution module. In one embodiment, the distribution module may be incorporated into the power supply or as a stand-alone component communicatively coupled to the power supply. As such, power supply 120 may be configured to receive line power 130 via wiring 5 from the existing power grid of the municipality. Wiring 5 may run from the ground and up through pole 4, through mast arm 6, arid into cavity 58 of housing 40 by way of openings 35/54 in base member 30 and internal ridge 52, respectively. In this way, line power 130 may arrive at power supply 120 and may be electrically coupled to power supply 120. As a power converter and distribution module, power supply 120 may be configured to take the received line power 130 and convert line power 130 into various degrees of low-voltage power needed to operate any one or more of the various auxiliary devices 70, as needed and required by each device 70. Power supply 120 may be configured to systematically and automatically recognize auxiliary devices 70 coupled to IDS 10 and determine the power requirements of each device 70 and may thereafter convert line power 130 into the specific power required by device 70 and then distribute or route this converted power to device 70. In the alternative, the specific power requirements of each device 70 may be input into IDS 10 via programming and updating control code 81 to do so. Yet, regardless of how IDS 10, control unit 80, processor 124, or control code 81 determines what power to send to each individual device 70, power supply 120, as a power converter and distribution module, may be configured to perform this line power reception, low-voltage conversion, and distribution for each auxiliary device 70 coupled to IDS 10, whether device 70 is positioned within housing 40 or external to housing 40. In like manner, luminaire 8 may be electrically coupled to power supply 120. As such, IDS 10 may be configured to control, convert, and distribute electric power to luminaire 8 according to the functions of IDS 10 described herein. In other words, as a power converter and distribution module, power supply 120, may be configured to perform this line power reception, low-voltage conversion, and distribution for the luminaire 8 in addition to each of the devices 70. The IDS 10 may be configured to take an existing source of line power 130 and convert this electric power to the individual power requirement needs of any and all electronic devices coupled to or related to the operations of IDS 10 and distributes this converted/required power according to the operational directives of IDS 10 as determined by sensory input from devices 70 or programmed directives of IDS 10. The IDS 10 may be configured to be retrofitted on existing poles 2 and with a single electrical connection to line power 130 become a facilitator of smart technology, with each IDS 10 being customizable with devices 70 to the needs of communities, municipalities, and citizenry as determined on a case-by-case basis or a pole-by-pole basis. The power supply 120 may be further configured to provide power to a remote device coupled to the pole structure that may or may not be directly coupled to the IDS 10. For example, the pole structure 4 may comprise a plurality of auxiliary devices 70 that interact with the IDS 10, but do not reside within the IDS 10 itself.

In another embodiment, as a power converter and distributor, power supply 120 may be configured to convert line power 130 to the low-voltage power needed to operate the various devices 70 of IDS 10 and control unit 80, as described above, but may leave untouched the electrical connections of luminaire 8. Thus, despite IDS 10 being coupled to line power 130 through power supply 120, luminaire 8 may be directly coupled to line power 130 as it was prior to installation of IDS 10. Or, through software and/or control code 81, IDS 10 may be configured to control some portion of the functions of luminaire 8 while luminaire 8 continues to receive its power from line power 130.

Power supply 120 may be modular and scalable having one or more input power channels 121 and output power channels 123. Input and output power channels 121, 123 may be programmable with flexibility to change the power format supplied and device specific power operational parameters as needed. For example, some devices of the IDS may require a higher voltage/current than a different device of the IDS 10. Power supply 120 may have an optional dedicated processor 127, governing the power from power supply 120 while maintaining real-time communication with processor 124 of control unit 80. In some embodiments, power supply 120 may also have direct communication capability with an external network (not shown). Power supply 120 may also be configured to receive and utilize photovoltaic power, such as from photovoltaic cell 100.

Embodiments of IDS 10 may further comprise a backup emergency battery, e.g., UPS 122, whose power may be selectively distributed to all essential services and devices during an emergency. UPS 122 may be also connected to photovoltaic cell 100 to receive power therefrom. UPS 122 may be networked with other input/output onboard environmental data collection, assessment, and operational devices, and have remote communication capability.

Embodiments of IDS 10 may further comprise low-voltage auxiliary devices 70 being housed within housing 40, on exterior surfaces of housing 40, on pole 4, in communication with pole 4 but below the ground surface (i.e., below grade), and in and on pole 4 in various locations, as desired and determined by intended use and configuration of IDS 10. As discussed above, luminaire 8 may be configured to operate on power and controls that have limited connectivity to IDS 10, wherein housing 40 of IDS 10 is merely a pass through for luminaire 8 power and control. Luminaire 8 may be configured to operate on power and controls that is directly connected to IDS 10 and controlled by IDS 10 operations, wherein IDS 10 governs operations and control of luminaire 8 and luminaire 8 is comprised merely of lamps and optical encasements. In other words, while luminaire 8 may contain hardware for dispensing light in low-light settings, control and operational aspects of luminaire 8 may be controlled and governed by IDS 10, such as hours of operation and illumination intensity just to name a few.

Data output from power supply 120 may include reporting on the quality of the input power from wiring 5 and/or input power channels 121, the operational temperature of power supply 120, the power consumption of power supply 120 including client devices such as communication module 126, processor 124, and auxiliary devices 70, time of usage broken down by device, and operational anomalies. Power supply 120 may process the highest electrical load of control unit 180 and may therefore be located proximate the interior surface 44 of housing cover 42 to exchange heat therewith to effectively cool power supply 120. Circuit boards (not shown) for power supply 120 may be wired by a conventional method or engaged by plug-in connectors. Additionally, the circuit boards may be encased or open and may be secured within cavity 58.

Embodiments of IDS 10 may further comprise control unit 80 including control code 81 that may be multi-device relational suite of software configured to operate, control, and otherwise govern auxiliary devices 70 independently or in unison. The suite of software may be configured to analyze a data set received by the control unit 80. The data set may be augmented with additional data captured and/or received from any of the electronic devices or auxiliary devices of the IDS 10, a remote client (e.g., first responder), and/or a remote device (e.g., a cell phone, RFID, or device located on the pole structure 4). Based on the augmented data set, the IDS 10 and/or the network of 1DSs 10 may be configured to perform a task. The IDS 10 may be configured to perform the task on a single IDS 10 device and/or a plurality of IDSs 10, electronic devices, and/or remote clients either independently or in conjunction with other IDSs 10, remote clients, and/or remote devices. In addition, processor 124 may be configured to execute control code 81 and thereby receive local device sensory input from one or more auxiliary devices 70 and then compile this information in accordance with pre-programmed instructions. Processed information may then be converted to actionable output to auxiliary devices 70. In addition, processor 124 may be configured to communicate with neighboring IDSs 10 or with other devices remotely located from IDS 10. Processor 124 may direct the communication of sensed information or pre-programmed instructions and/or directives based on sensed information to remote devices or remote clients, such as first responders, police departments, fire and rescue teams, etc. For example, in the case of an ongoing public emergency, the control unit 80, processor 124, and/or communication module 126 may be configured to gather, analyze, and report data and/or information back to the IDS 10. The received information may be transmitted to a remote client such as a first responder and/or the received information may be transmitted to a remote device, such as all cellular phones within a certain vicinity to prompt people to stay away from the area.

Embodiments of IDS 10 may further comprise processor 124 containing resident memory 125 that may be programmed with control code 81 prior installation in IDS 10 or on mast arm 6, during operational use, or at any time thereafter. For example, programming may be performed by a wired connection to a port, e.g., data line dock 57 connected to port 46 or wirelessly via antenna 47. Likewise, updates to IDS 10 in general, to control code 81, to operational instructions, or to device specific updates may occasionally be performed with occasional device upgrades. Indeed, because housing body 50 is configured with one or more receptacles on its bottom exterior surface, devices 70 may be updated, exchanged, interchanged, or replaced as needed according to device life expectancy, device configuration, or desired capabilities of IDS 10 for the particular location within the municipality. Embodiments of IDS 10 may further comprise docks 57 and any other similar input ports to IDS 10 being keyed to accept only approved network devices. With docks 57 being keyed to accept only authorized auxiliary devices 70, only those clients, customers, manufacturers that have been approved for working with IDS 10 may be permitted to couple their respective devices 70 thereto. Such keys may be digital access codes or may be programmed into IDS 10 control code 81 or into the software of individual auxiliary devices 70. In the alternative, such keys may be specifically required hardware (i.e., protectable shaped and sized connectors) for use in electrically coupling to IDS 10.

In one embodiment, the IDS 10 may be configured with any suitable system to easily and efficiently access, change out, replace, repair, exchange, or interchange component parts, including auxiliary devices 70. For example, the IDS 10 may be configured with an access door 40 on the lower section 1802 of the housing body 50. One IDS 10 may include some or all of auxiliary devices 70, whereas another IDS 10 may not include some or all of auxiliary devices 70. Many auxiliary devices 70 may be coupled to the underside surfaces of housing 40, whereas other primary components, such as power supply 120, processor 124, and communication module 126 may be accessed simply by removing housing cover 42 from housing body 50. And, because some or all of these devices are equipped with quick connect configurations, each of these devices may be easily removed, installed, or replaced, as needed.

Embodiments of IDS 10 may further comprise control code 81 being scalable by modules, where each module relates to the functionality of an associated device and its relation to other onboard devices and the entire network's devices. Control code 81 may be provided with input tables such as schedules and set points, as well as alert parameters and operational reports. In addition, control code 81 can be customized for specific applications and may include self-learning modules. Processor 124 may have sufficient memory 125 associated therewith to access and act on pertinent information in substantially real time. Substantially real time may comprise near-instantaneous transmission and receiving of information, or instantaneous/simultaneous transmission and/or receiving of information. It is understood that the transmission of information over a large distance may not be in real-time based on the method of transmission, and substantially real-time here leaves open the possibility that transmission/receiving is done with a slight delay. For example, if a first IDS 10 captures information related to a parameter of its surrounding environment, that information may be processed by the processor in substantially teal-time. Additionally, control code 81 may be provided with a self-reporting module associated with each auxiliary device 70 to report the device's operational condition and provide alerts when the device 70 performs outside its optimal performance range.

Embodiments of IDS 10 may further comprise each IDS 10 being assigned a unique address that is associated with the identification information of the pole 2 to which IDS 10 is connected. For example, each pole 2 or IDS 10 may be assigned a unique alphanumeric ID, or the pole 2 may be identified by its location according to GPS coordinates. Based on this unique ID, IDS 10 may be capable of assigning a sub-address to all devices 70 coupled or functionally connected to IDS 10. In this manner, the operational integrity of the various elements of auxiliary devices 70 may be monitored and any anomalies with onboard devices may be alerted, identifying the nature of the anomaly and possible recommendations for action. Information specific to each auxiliary device 70 may be recorded and stored for retrieval upon status inquiry. Information may include device manufacturer, device serial number, date of installation, license renewal alerts, warranty control, device reliability and life expectancy, event records, and maintenance schedules. Moreover, under the condition that an IDS 10 senses an environmental input that triggers a local and/or remote client response, the unique address of the IDS 10 may be communicated to the client(s) to allow the client(s) to arrive at the correct destination o address and/or resolve the situation or problem.

Embodiments of IDS 10 may further comprise IDS 10 functioning as a local environment area manager. For example, control unit 80 and control code 81 may work hand-in-hand to facilitate direct, or via processor 124, communication with onboard auxiliary devices 80. Additionally, communication module 126 may be configured to facilitate communication between onboard auxiliary devices 80, as well as between a plurality of IDSs 10, as well as between local and remote municipality management systems, s well as between local and remote clients, such as first responders, police, fire and rescue, EMTs, and others that may need real-time input about a specific location in a part of the community. Communication module 126 may employ radio frequency (RF) communication via antenna 47 to facilitate remote communication with other electronic devices and systems. For example, electronic ear 86 may pick up an auditory input or signal from the surrounding environment that is consistent with a preprogrammed auditory input that triggers further action from IDS 10, such auditory input being, for example, the sound of a vehicle collision on or near the roadway. IDS 10, in response to the auditory input and preprogrammed instructions associated therewith, may activate mechanical eye 60 to provide a real-time view of the scene. Moreover, IDS 10, in response to the auditory input and preprogrammed instructions, may communicate with remote clients to direct first responders to the scene and may communicate with neighboring IDSs 10 and possibly traffic lights to regulate and direct traffic flow away from or around the scene, as needed. Such capability of IDS 10 to respond to environmental input and perform necessary operations, such as directing IDS 10 operations and communicating with remote clients and devices, may be especially important if the vehicle occupant is disabled by the vehicle collision and cannot perform these functions himself/herself.

IDS 10 may be programmed in similar fashion to respond accordingly to any number of environmental conditions measurable by any of auxiliary devices 70 on IDS 10. As such, auxiliary devices 70 may be utilized in connection with lighting control, traffic control, life safety, loss prevention, asset management functions, and/or operational optimization.

Lighting control may entail IDS 10 being configured to govern time of use or lighting intensity of luminaire 8, Lighting control may also entail one or more IDSs 10 cooperating with one another to turn on or off or dim as vehicle or pedestrian traffic passes thereunder or thereby. IDS 10 may be programmed to turn luminaire 8 off if IDS 10 does not sense movement thereunder, thus preserving energy consumption and prolonging life expectancy of luminaire 8.

Traffic control may entail IDS 10 being configured to provide local and remote monitoring of traffic patterns, traffic backups, traffic accidents, and roadway obstructions. Traffic control may entail IDS 10 being configured to govern traffic light operations and recommend alternative traffic routes based upon traffic flow and accident reports discovered by one or more IDSs 10 in the community and along roadways. Traffic control may entail IDS 10 being configured to govern traffic light operations to allow first responders to arrive at the scene of an accident or emergency in as little time as possible. Traffic control may entail IDS 10 being configured to govern traffic light operations to allow funeral processions to proceed along roadways with as little interference or traffic flow disruption as possible. Traffic control may entail IDS 10 being configured to monitor crowd control at large public events, such as concerts, swap meets, sporting events, and the like. Audible and/or visible commands may be given by IDS 10 to local and remote devices/client in response to sensed input of crowd density, crowd noise, crowd movement, and the like.

Life safety may entail IDS 10 being configured to provide local and remote monitoring of air quality, including discovering airborne contaminants and threats. As one IDS 10 senses an airborne contaminant, the one IDS 10 may relay this information to neighboring IDSs 10 and other remote devices or remote clients. As such, the network of 1DSs 10 may coordinate information and communicate with one another to provide a "safety net" of helpful information over communities and roadways. Life safety may entail IDS 10 being configured to audibly and/or visibly warn surrounding communities and vehicle and pedestrian traffic on roadways of impending danger up along the roadway or approaching danger from behind on the roadway, such as a high-speed chase. Life safety may entail IDS 10 being configured to provide local and remote monitoring of weather patterns and temperature patterns, such as deep freezes, humid conditions, extreme heat, or high winds. Audible and/or visible commands may be given by IDS 10 to local and remote devices/client in response to sensed input of weather conditions, temperature, and the like. Life safety may entail IDS 10 being configured to analyze traffic patterns and traffic flow in and around traffic accidents, traffic emergencies, or other localized non-traffic emergencies, such as fires and the like, to reroute traffic to prioritize optimal routes for first responders. IDS 10 may be configured to locate first responders and, based on their respective positions, anticipate quickest routes by calculating time from current location to arrival on scene, and configure traffic patterns and traffic flow to permit first responders to arrive on scene in as little time as possible. IDS 10 may be configured to divert non-essential traffic to a different route to optimize first responder response.

Loss prevention may entail IDS 10 being configured to monitor public environments for suspicious activity of local and remote clients to prevent theft, crime, or disorderly conduct, or the like via sensory input from auxiliary devices 70 and behavioral software analysis of sensed input. Loss prevention may entail one or more IDSs 10 being configured to monitor location of stolen vehicles or vehicles identified in an AMBER alert operation. One or more IDSs 10 may be configured to have a mechanical eye 60 that may be configured to read vehicle license plate numbers and/or faces and features of pedestrians that pass thereby. Control unit 80 may thereafter process this visual information and communicate the identification and location of the identified vehicle or person in question once discovered. Loss prevention may entail IDS 10 being configured to sound an audible and/or visual alarm for sensed abnormalities, such as unauthorized entry into a vehicle where IDS 10 has been informed the vehicle is not to be entered or unauthorized removal of a vehicle from a parking stall where IDS 10 has been informed the vehicle is not to be moved.

Asset management may entail IDS 10 being configured to visually monitor roadway conditions and markings, such as the presence of potholes in the roadway or the deterioration of paint stripes and pedestrian walkways. Asset management may entail IDS 10 being configured to visually monitor ease of vehicle and pedestrian traffic flow to determine if redesign of roadways or walkways or space reallocation is needed.

Operational optimization may entail IDS 10 being configured to monitor energy being used thereby, to monitor and track maintenance history, to record events and keep an event history, and perform device and system performance evaluations, and so forth.

Figure 13:
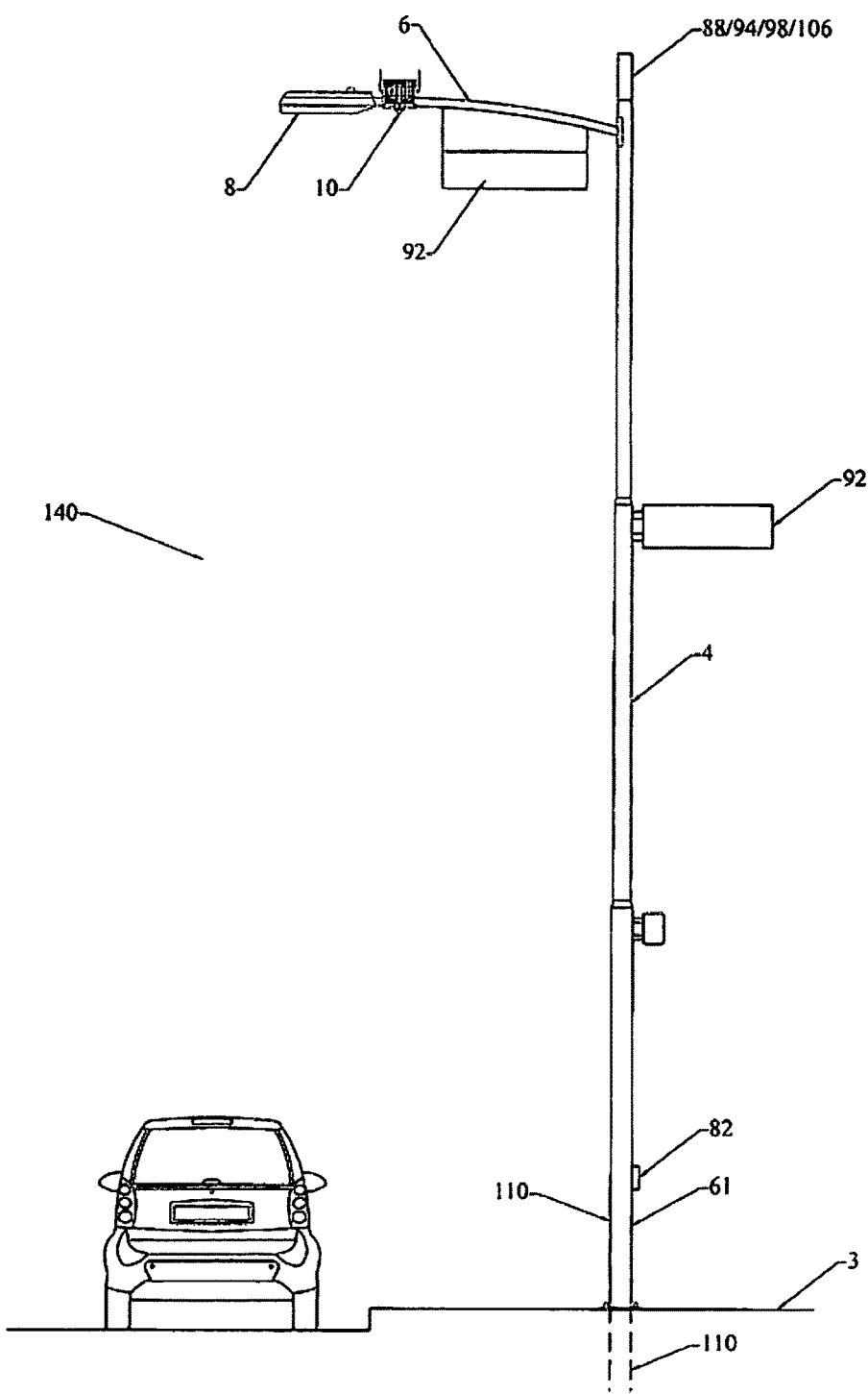
FIG. 13 is a side view of an embodiment of an intermediate device structure/system in accordance with the present disclosure.

With reference to FIG. 13, implementation of IDS 10, and its component parts and associated function as described herein, on a conventional illumination pole 2 coverts illumination pole 2 into a "smart pole" 140. Smart pole 140 may include IDS 10 being physically coupled to pole 140 in between conventional luminaire 8 and conventional mast arm 6, as described in greater detail previously. As mentioned previously with respect to component features of IDS 10, these components may be positioned remotely from housing 40 of IDS 10, but may nevertheless be positioned on, near, or around smart pole 140 to form part and portion of IDS 10, which makes smart pole 140 "smart." Smart pole 140 may further comprise electrified signage 92 at one or more positions on mast arm 6 or pole 4. Smart pole 140 may further comprise, at a top portion thereof, communication device 94, wind velocity sensor 98, barometric sensor 88, and/or transceivers for wireless communication of all types and varieties. Smart pole 140 may further comprise metering device 82 to meter how much power is consumed by each component device in operation by IDS 10. Metering device 82 may also be a user interface for operating features of IDS 10, as will be described in greater detail herein. Smart pole 140 may further comprise vibration monitor 112 for monitoring vibrations in and around smart pole 140. Abnormal vibration patterns or vibrations outside normal operating conditions may be relayed to IDS 10 and IDS 10 may communicate this information to remote clients. Smart pole 140 may further comprise structural integrity sensor 110 that may be configured to monitor soil conditions or foundation conditions below smart pole 140. Abnormal structural integrity that falls outside normal operating conditions may be relayed to IDS 10 and IDS 10 may communicate this information to remote clients. Smart pole 140 may further comprise one or more infrared sensors 61 (such as a motion sensor) for sensing the presence or absence of pedestrian traffic at crosswalks or other pathways. Indeed, infrared sensor 61 may be configured to automate crosswalk indicators on traffic lights and traffic lights themselves. For example, under the condition infrared sensor 61 senses the presence of a pedestrian on the corner of an intersection, senses that the pedestrian has lingered on the corner for an amount of time longer than a predetermined amount of time, and judges which direction the pedestrian intends to cross the street, infrared sensor 61 may communicate with control unit 80 and processor 122. Control unit 80 and processor 122 may direct IDS 10 to communicate with crosswalk lights and traffic lights to change color to stop traffic, flash a walking sign to the pedestrian, and allow the pedestrian to cross the street. All this may be accomplished without the pedestrian having to physically push a button to activate crosswalk or traffic light features.

A feature of IDS 10 is the capability to operate one or several onboard devices from among auxiliary devices 70, such as mechanical eye 60, backup battery 119, metering device 82, drone launch and charging pad 84, electronic ear 86 (such as a microphone or other auditory instrument), barometric sensor 88, air quality sensor 90, electrified signage 92, communication device 94, structural integrity sensor 96, wind velocity sensor 98, photovoltaic cell 100, RFID reader 102, radar 104, broadband communication hardware 106 (such as WIFI/WiMAX transponders, transceivers, and other communication gear; 3G and 4G communication gear), speaker 108, corrosion monitor 110, vibration monitor 112 (such as a piezoelectric sensor), GPS technology 114, power storage unit 116 (such as a battery or backup power unit), radiation sensor 118, seasonal lighting displays, long-term and short-term electrified signage, astronomical clock for keeping and tracking time, thermometer of any variety for measuring one or more temperatures, one or more photocells, and one or more infrared sensors (such as motion sensors) in unison, based on real-time information sensed by these devices 70 and according to processing and directives coordinated by control unit 80 and programmed instructions in control code 81.

A feature of IDS 10 is the capability to perform auto-commissioning of a network of IDSs 10. For example, as mentioned, each IDS 10 may include a discrete address, and sub-addresses for component parts, that may form part of an electronic map showing each IDS 10 by its associated discrete address and its relative location to the entire network of IDSs 10. Auto-commissioning may commence following installation and implementation of IDS 10 on pole 2 to create smart pole 140, wherein IDS 10 marks its place on the electronic map by GPS coordinates.

In one embodiment, the IDS 10 may comprise GPS technology 114. The GPS technology 114 may comprise a global positioning system module configured to receive and/or report information related to the geographical location of the pole structure on which the GPS technology 114 is mounted. The GPS technology 114 may send information to the control unit 80 related to the geographical location of the pole so that repairs may be made. The GPS technology 114 may further be configured to report information to remote clients and/or remote devise.

In one embodiment, the IDS 10 may comprise an accelerometer disposed on a portion of the pole structure 4. The accelerometer may comprise any suitable device and/or system configured to measure acceleration, vibration, and/or other related parameters. The accelerometer may be configured to report on the current structural integrity of the pole structure. For example, a pole structure may experience vibrations during an earthquake and/or severe wind conditions which may exceed the structural limitations of the pole structure. The accelerometer may determine using the data set comprising the parameters of the surrounding environment to determine whether the structural limitations of the IDS 10 are exceeded. The accelerometer may be configured to report information related to the structural integrity of the pole structure to a plurality of additional IDSs 10, remote clients, remote devices, electronic devices, and/or auxiliary devices 70.

Figure 14:
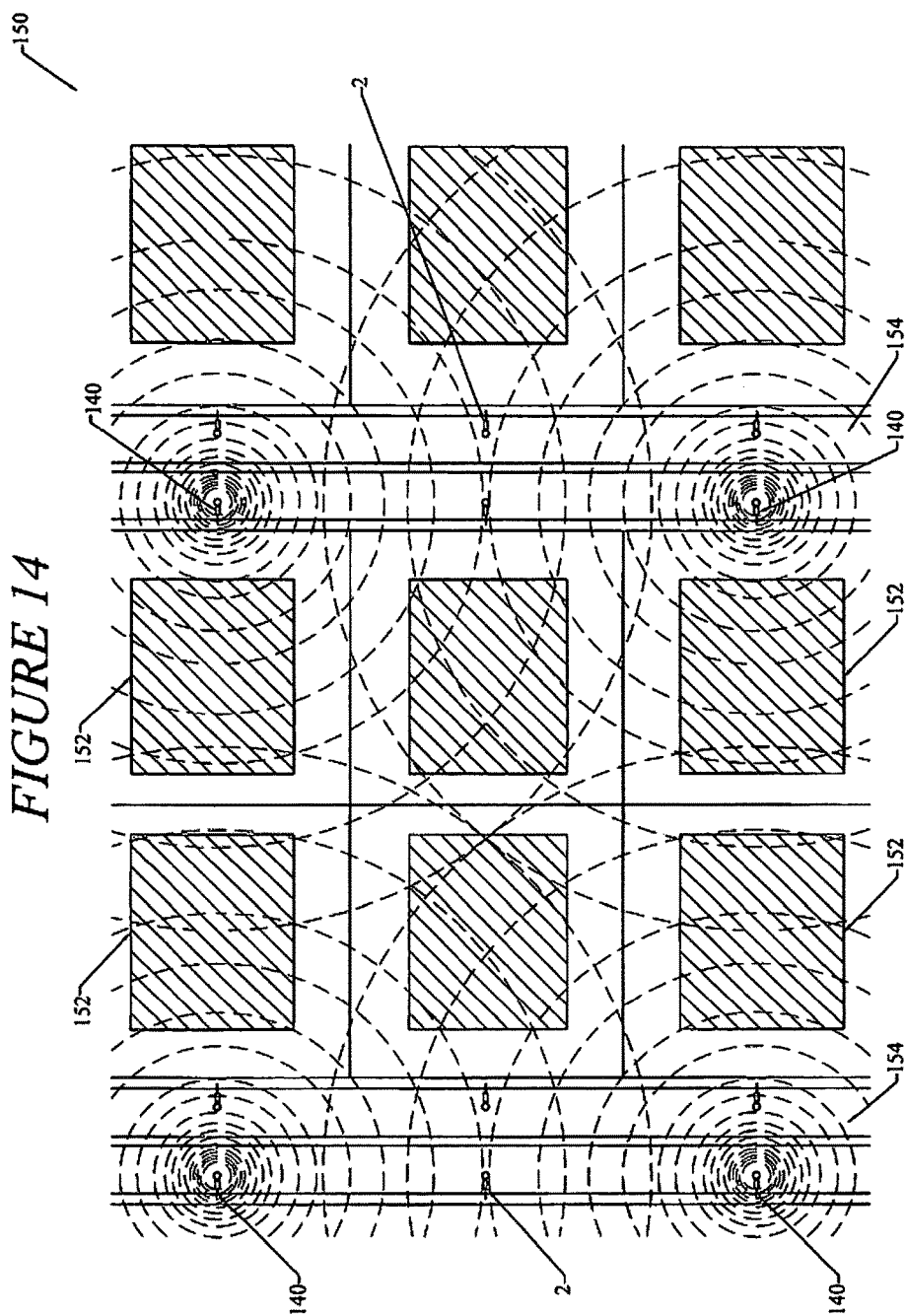
FIG. 14 is a top view of an embodiment of an intermediate device structure/system in accordance with the present disclosure.

A related feature of IDS 10 is the capability to function as part of a larger-scale mashed wireless network 150. As depicted in FIG. 14, one or more poles 4 along roadway 154 may be strategically chosen and equipped with IDS 10 having pole mounted transceivers, such as broadband communication hardware 106, to become smart pole 140 and provide citywide coverage for internet communication, as depicted by concentric dashed lines. Building structures 152, as well as public spaces there between may have access to the provided internet communication. In addition to internet communication, other communication channels may be provided separately for non-public essential and emergency services. These communication services may share the smart pole 140 real estate, having both for profit and not for profit communication. Utilizing this meshed network 150, multiple municipal functions can be executed efficiently. These functions may include monitoring, controlling, metering, and alerting, employing a minimal amount of human and material resources of the community, municipality, and/or citizenry.

A feature of IDS 10 is the capability to control light from its respective luminaire 8 at its local location. As discussed above, IDS 10 may include mechanical eye 60, communication module 126, processor 124 and/or remote processors. Processor 124 and/or the remote processors may maintain a pre-determined light level by dimming or turning luminaire 8 on or off through processing in real-time local zone illumination conditions data obtained by mechanical eye 60 and preprogrammed local or remote controller instructions. Motion detectors may also be utilized to monitor or sense movement to trigger operation of luminaire 8 by IDS 10.

Figure 15:
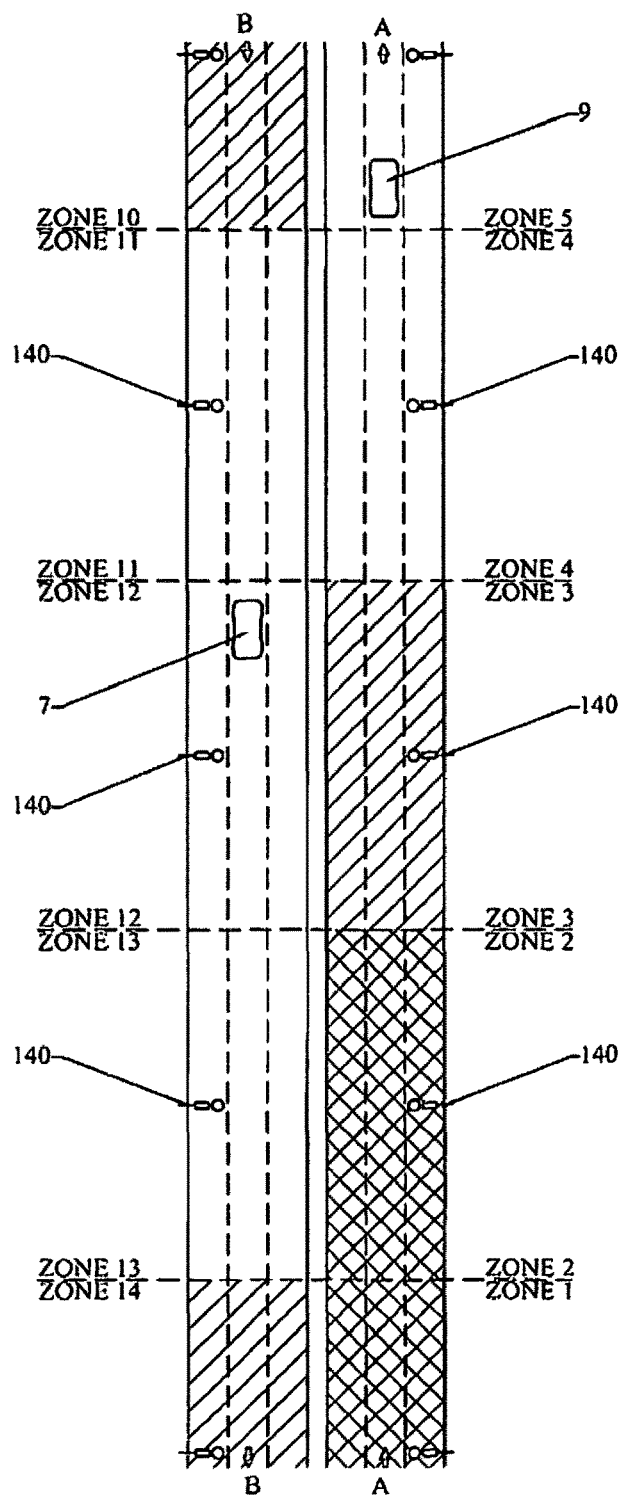
FIG. 15 is a top view of an embodiment of an intermediate device structure/system in accordance with the present disclosure.

With reference to FIG. 15, a roadway may be divided into predetermined zones, such as zones 1-10. One or more IDSs 10 may be configured to monitor traffic and pedestrian flow in each of zones 1-10 and correspondingly adjust light operation and light intensity from each corresponding luminaire 8 depending on traffic flow Under the condition that IDS 10 does not sense any traffic movement, such as during late night/early morning hours when traffic is scarce, the respective IDS 10 may instruct its luminaire 8 to be dimmed or to turn completely off. However, under the condition when IDS 10 receives sensory input from mechanical eye 60 or other sensors, such as motion sensors, IDS 10 may instruct luminaire 8 to turn on and shine at full brightness. For example, vehicle 7 may be traveling in the direction of arrow B and vehicle 9 may be traveling in the direction of arrow A, opposite that of the direction of arrow B. IDSs 10 may sense that vehicle 7 is in zone 12. As such, 1DSs 10 associated with zones 11, 12, 13 (the immediate zone in which vehicle 7 is positioned (zone 12), as well as the zone vehicle 7 just left (zone 11) and the zone vehicle 7 will enter next (zone 13)) may be lit up with 100% light output from luminaire 8. Further, IDSs 10 associated with zones 10 and 14 may be lit up with 50% (or some percentage short of 100%) light output from luminaire 8. Any zones beyond this, such as zone 9 or zone 15 may be completely dark, as IDSs 10 associated with these zones are instructing luminaires 8 to remain dark because of a lack of sensed traffic. This can be more fully understood by viewing vehicle 9 in zone 5. Zones 5 and 4 are instructed by their respective IDSs 10 to illuminate at 100%, whereas zone 3 is instructed by its respective IDSs 10 to illuminate at 50%, and whereas zones 2 and 1 are instructed by their respective IDSs 10 to illuminate at 0%. In this particular figure, crosshatching illustrates 0% illumination, hatching illustrates 50% illumination, and no hatching illustrates 100% illumination by respective luminaires 8. Each IDS 10 may communicate with neighboring IDSs 10 about current traffic flow to seamlessly transition light output from respective luminaires 8 along roadways and walkways.

A feature of IDS 10 is the capability to optimize local and entire space environmental conditions. Optimization methodology may utilize data from mechanical eye 60, motion detectors, as well as other onboard sensor devices such as processor 124, mechanical ear 86, communication module 126, and/or remote processors to process data and act in real time (or substantially real time) on changing conditions while operating within programmatic instruction guidelines.

Figure 16:
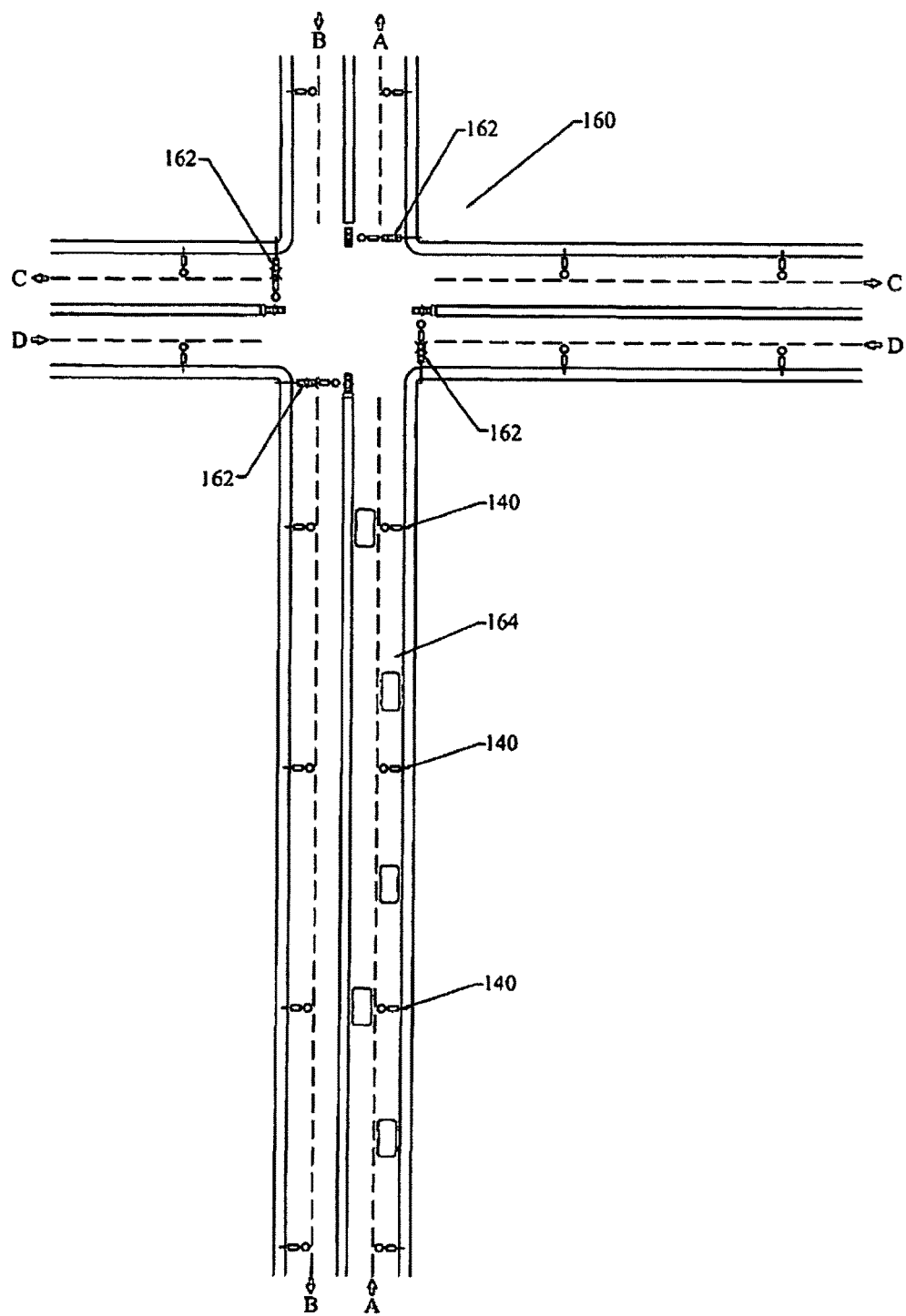
FIG. 16 is a top view of an embodiment of an intermediate device structure/system in accordance with the present disclosure.

For example, as depicted in FIG. 16, mechanical eye 60 on each IDS 10 may be configured to monitor vehicle flow, including sensing and recording vehicle load, speed, and direction of travel. Using these sensed results, each IDS 10 may calculate the anticipated arrival time of traffic flow at the next traffic intersection 160. This information may then be communicated to neighboring intersection traffic signal controllers 162 that can utilize this information to control the flow of traffic in the most efficient manner. Also, the controller 162 can transmit information to electronic boards (not depicted) along the path of travel to the intersection, broadcasting the travel speed needed for passing vehicles to enter the intersection on a green light. Utilizing IDS 10 in this way, may reduce stop and go traffic, accidents, noise, pollution, and vehicular and roadway wear and tear. As depicted, FIG. 16 shows IDSs 10 along lane A of roadway 164 sensing vehicles traveling on lane A toward intersection 160. IDSs 10 at other locations along lanes B, C and D sense that there is no vehicle traffic within these lanes B. C, or D. Using this collective information, shared between IDSs 10 and from IDSs 10 to controllers 162, traffic light controllers 162 may maintain a green light for lane A, for vehicles thereon traveling toward the intersection 160.

A feature of IDS 10 is the capability to collect environmental conditions data via mechanical eye 60 and relay the data to local processor 124 and/or remote processors. The data collected by mechanical eye 60 may include, but is not limited to, parking stall occupancy, a traffic count, vehicle load density analysis, time of day activity logging, and photographic and thermal imagery. The processed data obtained by mechanical eye 60 with or without additional information processed from other non-camera devices within IDS 10 facilitate optimal operation of IDS 10. Another feature of IDS 10 is to function as a public announcement, sound, and alarming system through the provision of audio input/output via mechanical ear 86 and speaker 108 (mechanical voice). Additionally, mechanical ear 86 and speaker 108 (mechanical voice) may be networked with other input/output onboard environment data collection, assessment, and operational devices, and have remote communication capability.

For example, as depicted in FIGS. 17A-C, smart poles 140 may be configured in a parking lot to administer parking lot activities and fees. Each smart pole 140 may have configured thereon an IDS 10, including mechanical eye 60. Each IDS 10 may be configured to monitor a specific number of parking stalls, such as 1R to 5R and 1L to 5L. Unique pole ID 79 may be displayed on pole 140. When a vehicle covers a specific stall, the driver, using a user-interface 83 touch panel on pole 140, associates the car stall location, 1R to 5R or 1L to 5L, with the time needed for parking. The driver may then pay the needed or required amount for parking by swiping a credit card in the provided metering device 82. If time expires and/or the car is parked without paying the fee, the mechanical eye 60 may detect the presence of the car and the IDS 10 may communicate with a local or remote meter maid and/or record the vehicle's license plate. On the other hand, if the driver has a subscription and employs an on-board card or RFID tag that is carrying credit and is providing a signal that is readable by an RFID reader 102 (or other similar signal reader technology) mounted on the IDS 10, IDS 10 may authorize an automatic charge to the on-board card or tag (or account associated therewith) for the amount of money corresponding to the parking duration.

In summary, embodiments described above address a number of the mechanical, thermal, electrical, airborne, and architectural challenges that are commonly associated with community roadways, intersections, walkways, and publicly accessible paths. Furthermore, the mechanical arrangement and electronics assembly of IDS 10 may assume partial or full control over the ambient environment in the vicinity of the IDS, integrating operational logic traditionally associated with isolated disciplines' networks of traffic flow, first response, crowd control, parking monitoring, public safety, air quality monitoring devices, input/output audio devices, temperature and humidity devices, security and normal operation monitoring cameras, occupancy sensors, lighting controls, and so forth. Consequently, the IDS 10 including the mechanical arrangement and the electronics assembly yields significant improvements in terms of the integration of a variety of disciplines associated with community roadways, intersections, walkways, and publicly accessible paths. Moreover, IDS 10 accomplishes all of these without compromising the structural integrity of existing structures (i.e., illumination poles 2) already owned by the community, municipality, and/or citizenry.

While the principles of the disclosed subject matter have been described in connection with specific apparatus configurations described above, it s to be clearly understood that this description is made only by way of example and not as a limitation on the scope of the disclosed subject matter. For example, embodiments may be implemented in systems having other architectures as well. The various functions or processing blocks discussed herein and illustrated in the FIGS. may be implemented in hardware, firmware, software or any combination thereof. Further, the phraseology or terminology employed herein is for the purpose of description and not of limitation.

While this disclosure has been described in conjunction with the specific embodiments outlined above, it is evident that many alternatives, modifications and variations will be apparent to those skilled in the art. Accordingly, the preferred embodiments of the present disclosure as set forth above are intended to be illustrative, not limiting. Various changes may be made without departing from the spirit and scope of the present disclosure, as required by the following claims. The claims provide the scope of the coverage of the present disclosure and should not be limited to the specific examples provided herein.

The particular implementations shown and described are illustrative of the invention and its best mode and are not intended to otherwise limit the scope of the present invention in any way. Indeed, for the sake of brevity, conventional manufacturing, connection, preparation, and other functional aspects of the system may not be described in detail. Furthermore, the connecting lines shown in the various figures are intended to represent exemplary functional relationships and/or steps between the various elements. Many alternative or additional functional relationships or physical connections may be present in a practical system.

In the foregoing specification, the invention has been described with reference to specific exemplary embodiments. Various modifications and changes may be made, however, without departing from the scope of the present invention as set forth in the claims. The specification and figures are illustrative, rather than restrictive, and modifications are intended to be included within the scope of the present invention. Accordingly, the scope of the invention should be determined by the claims and their legal equivalents rather than by merely the examples described.

For example, the steps recited in any method or process claims may be executed in any order and are not limited to the specific order presented in the claims. Additionally, the components and/or elements recited in any apparatus claims may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used herein, the terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

The invention claimed is:

1. A network of intermediate device systems, wherein each intermediate device system coupled to a pole structure electrically connected to a power source, comprising:
   a plurality of electronic devices;
   a bidirectional communication module and an auxiliary devices sensing an environmental parameter of an area surrounding the intermediate device system; and
   a control unit communicatively coupled to a processor, wherein the processor receives and processes information from the auxiliary device and at least one of a remote device, and decides on prioritized operational instruction in response to processing the information, wherein:
      the prioritized operational instruction operates the auxiliary device and the remote device and combinations thereof having the highest priority based on the environmental parameter of the area surrounding the intermediate device system, programmatic parameters and remote instructions.

2. The intermediate device system of claim 1, further comprising a power supply coupled to at least one of the control unit and the communication module, wherein the power supply converts the electrical power from one format to another format.

3. The intermediate device system of claim 2, further comprising a landing pad for receiving an unmanned aerial vehicle disposed on a top surface of the attachment system, wherein the landing pad is configured to receive power from the power supply.

4. The intermediate device system of claim 1, wherein the incoming data set received by the communication module triggers activation of the at least one of the plurality of electronic devices of the at least one of:
   the intermediate device system; and a second intermediate device.

5. The intermediate device system of claim 1, wherein the communication module is further configured to transmit the prioritized operational instruction to the remote device.

6. The intermediate device system of claim 1, wherein the communication module is further configured to receive a second incoming operational instruction from the remote device, wherein the second incoming operational instruction is configured to operate the at least one of a plurality of electronic devices.

7. The intermediate device system of claim 6, wherein the second incoming data set received from the remote client triggers activation of the at least one of the plurality of electronic devices of the at least one of the intermediate device system, the second intermediate device, and a remote device.

8. The intermediate device system of claim 1, further comprising a global positioning system module communicatively coupled to the control unit, wherein the global positioning system module is configured to report a geographical location of at least a portion of the pole structure to at least one of a plurality of additional intermediate device systems and at least one of a plurality of remote clients.

9. The intermediate device system of claim 1, further comprising an accelerometer communicatively coupled to the control unit, wherein the accelerometer is configured to report violent pole disposition.

10. The intermediate device system of claim 1, further configured to operate a suite of software, wherein the software is configured to:
  analyze the data set; augment the data set with additional data from the plurality of electronic devices, auxiliary devices, remote clients, and remote devices; and
  perform a task based on the augmented data set, where the task may be performed by an individual intermediate device system or a plurality of intermediate device systems.

11. The intermediate device system of claim 1, wherein the intermediate device system is in communication with a mobile device.

12. The intermediate device system of claim 11, wherein the intermediate device system communicates navigational data to the mobile device.

* * * * *